(12) United States Patent
Na et al.

(10) Patent No.: US 10,938,179 B2
(45) Date of Patent: Mar. 2, 2021

(54) ADDRESSABLE LASER ARRAY DEVICE INCLUDING VERTICAL CAVITY SURFACE EMITTING LASERS ADOPTING NANOSTRUCTURE REFLECTOR DISPOSED AT INTERSECTIONS OF PLURAL WIRING PATTERNS

(71) Applicants: SAMSUNG ELECTRONICS CO., LTD., Suwon-si (KR); UNIVERSITY OF MASSACHUSETTS, Boston, MA (US)

(72) Inventors: Byunghoon Na, Suwon-si (KR); Mahdad Mansouree, Amherst, MA (US); Seunghoon Han, Seoul (KR); Amir Arbabi, Amherst, MA (US)

(73) Assignees: SAMSUNG ELECTRONICS CO., LTD., Suwon-si (KR); UNIVERSITY OF MASSACHUSETTS, Boston, MA (US)

( * ) Notice: Subject to any disclaimer, the term of this patent is extended or adjusted under 35 U.S.C. 154(b) by 166 days.

(21) Appl. No.: 16/360,649

(22) Filed: Mar. 21, 2019

(65) Prior Publication Data
US 2020/0083669 A1    Mar. 12, 2020

(30) Foreign Application Priority Data

Sep. 12, 2018 (KR) .................. 10-2018-0109177

(51) Int. Cl.
*H01S 5/183* (2006.01)
*H01S 5/343* (2006.01)
(Continued)

(52) U.S. Cl.
CPC .......... *H01S 5/18361* (2013.01); *G01B 11/14* (2013.01); *G01B 11/24* (2013.01);
(Continued)

(58) Field of Classification Search
CPC ......... G01B 11/14; G01B 11/24; G01P 13/00; H01S 5/0421; H01S 5/0425;
(Continued)

(56) References Cited

U.S. PATENT DOCUMENTS 6,023,485 A * 2/2000 Claisse ............... H01S 5/18308
                                                    372/46.01
6,683,898 B2   1/2004 Ostergaard et al.
(Continued)

*Primary Examiner* — Que Tan Le
(74) *Attorney, Agent, or Firm* — Sughrue Mion, PLLC

(57) ABSTRACT

Provided are an addressable laser array device and an electronic apparatus including the addressable laser array device. The addressable laser array device includes a plurality of VCSELs, each including a distributed Bragg reflector (DBR), a nanostructure reflector including a plurality of nanostructures having a sub-wavelength dimension, and a gain layer disposed between the DBR and the nanostructure reflector; a plurality of first wiring patterns extending in a first direction and being electrically connected to the plurality of VCSELs, respectively; and a plurality of second wiring patterns extending in a second direction intersecting the first direction and being electrically connected to the plurality of VCSELs, respectively, wherein the plurality of VCSELs are disposed at intersections of the plurality of first wiring patterns and the plurality of second wiring patterns, and the addressable VCSEL array device is configured to selectively drive at least some of the plurality of VCSELs.

22 Claims, 20 Drawing Sheets

(51) Int. Cl.
    *H01S 5/347* (2006.01)
    *H01S 5/42* (2006.01)
    *G01P 13/00* (2006.01)
    *H01S 5/042* (2006.01)
    *G01B 11/24* (2006.01)
    *G01B 11/14* (2006.01)
(52) U.S. Cl.
    CPC ............ *G01P 13/00* (2013.01); *H01S 5/0421* (2013.01); *H01S 5/0425* (2013.01); *H01S 5/343* (2013.01); *H01S 5/347* (2013.01); *H01S 5/423* (2013.01)
(58) Field of Classification Search
    CPC .. H01S 5/18361; H01S 5/423; H01S 5/02276; H01S 5/04256
    USPC .............................................. 250/214 R, 239
    See application file for complete search history.

(56) References Cited

U.S. PATENT DOCUMENTS

| | | |
|---|---|---|
| 7,697,588 B2 | 4/2010 | Hori et al. |
| 2016/0072258 A1 | 3/2016 | Seurin et al. |
| 2017/0365984 A1 | 12/2017 | Lipson |

\* cited by examiner

ADDRESSABLE LASER ARRAY DEVICE INCLUDING VERTICAL CAVITY SURFACE EMITTING LASERS ADOPTING NANOSTRUCTURE REFLECTOR DISPOSED AT INTERSECTIONS OF PLURAL WIRING PATTERNS

CROSS-REFERENCE TO RELATED APPLICATIONS

This application claims priority from Korean Patent Application No. 10-2018-0109177, filed on Sep. 12, 2018 in the Korean Intellectual Property Office, the disclosure of which is incorporated herein in its entirety by reference.

BACKGROUND

1. Field

Example embodiments of the present disclosure relate to addressable laser array devices including a plurality of vertical cavity surface emitting lasers (VCSELs) adopting a nanostructure reflector and electronic apparatuses including the addressable laser array devices.

2. Description of the Related Art

Vertical cavity surface emitting lasers (VCSELs) have lower power consumption than edge emitting lasers (EELs) because of a short optical gain length. Also, the VCSELs are easier to be integrated. While an EEL is asymmetrical with respect to an optical output, a VCSEL may operate in a circular symmetrical output mode, which enables a more efficient low-noise and stable high-speed modulation because the VCSEL is connected to an optical fiber.

The VCSEL includes a distributed Bragg reflector (DBR) having a relatively high reflectivity of about 98% or more for constituting a laser resonator. As the DBR consists of pairs of two materials with different refractive indices, a lamination structure of several tens of layers is required in order to achieve a relatively high reflectivity. Also, the DBR has a relatively low thermal conductivity (or high thermal resistance) due to phonon scattering that occurs at an interface between two materials. There has been a need for a technique and a method capable of improving light control and light emission characteristics while compensating for disadvantages of the DBR.

SUMMARY

One or more example embodiments provide addressable laser array devices configured to improve light emission characteristics and light control characteristics.

One or more example embodiments also provide addressable laser array devices including a plurality of vertical cavity surface emitting lasers (VCSELs) adopting a nanostructure reflector having a sub-wavelength dimension.

One or more example embodiments also provide electronic apparatuses adopting the addressable laser array devices.

Additional aspects will be set forth in part in the description which follows and, in part, will be apparent from the description, or may be learned by practice of example embodiments.

According to an aspect of an example embodiment, there is provided an addressable vertical cavity surface emitting laser (VCSEL) array device including a plurality of VCSELs, each of the plurality of VCSELs including a distributed Bragg reflector (DBR), a nanostructure reflector, and a gain layer disposed between the DBR and the nanostructure reflector, wherein the nanostructure reflector includes a plurality of nanostructures having a sub-wavelength dimension, a plurality of first wiring patterns extending in a first direction and being electrically connected to the plurality of VCSELs, respectively, and a plurality of second wiring patterns extending in a second direction intersecting the first direction and being electrically connected to the plurality of VCSELs, respectively, and wherein the plurality of VCSELs are disposed at intersections of the plurality of first wiring patterns and the plurality of second wiring patterns, and wherein the addressable VCSEL array device is configured to selectively drive at least some of the plurality of VCSELs.

The addressable VCSEL array device may further include a substrate, a flat type mirror layer disposed on the substrate, the DBR being included in the flat type mirror layer, and a plurality of contact layer patterns extending in the first direction and disposed on the flat type mirror layer, wherein a plurality of the gain layers included in each of the plurality of VCSELs are disposed on each of the plurality of contact layer patterns, and wherein the nanostructure reflector is disposed on each of the plurality of gain layers.

The addressable VCSEL array device may further include an insulating passivation layer disposed on the flat type mirror layer and filling a space between the plurality of VCSELs, wherein the insulating passivation layer is disposed to cover the plurality of first wiring patterns, and wherein the plurality of second wiring patterns are disposed on the insulating passivation layer.

The plurality of first wiring patterns may be disposed on the plurality of contact layer patterns, are respectively spaced apart from the plurality of gain layers, and are electrically connected to lower surfaces of the plurality of gain layers, respectively, and the plurality of second wiring patterns may be disposed on the plurality of gain layers, the plurality of second wiring patterns being electrically connected to upper surfaces of the plurality of gain layers, respectively.

The plurality of first wiring patterns may include a plurality of first openings configured to expose the plurality of contact layer patterns, respectively, and the plurality of gain layers may be disposed in the plurality of first openings, respectively.

The plurality of second wiring patterns may include a plurality of second openings, and each of the plurality of second openings may be configured to expose each of the plurality of nanostructure reflectors.

The addressable VCSEL array device, wherein each of the plurality of first wiring patterns may include a first pattern portion surrounding each of the plurality of gain layers and a second pattern portion extending from both ends of the first pattern portion, and the second pattern portion may have a smaller width than the first pattern portion.

The first pattern portion may have one of a circular, elliptical or rectangular structure with an opening region at a center thereof.

The addressable VCSEL array device may further include a ring type electrode disposed on each of the plurality of gain layers, and the second wiring pattern may be formed to electrically contact the ring type electrode.

The addressable VCSEL array device may further include a substrate, a flat type mirror layer disposed on the substrate, the DBR being included in the flat type mirror layer, a plurality of first contact layer patterns disposed on the flat type mirror layer, a plurality of the gain layers disposed on the plurality of first contact layer patterns, a plurality of second contact layer patterns disposed on the plurality of gain layers, a plurality of the nanostructure reflectors disposed on the plurality of second contact layer patterns, wherein each of the plurality of first wiring patterns include a first contact metal interconnecting at least two of the plurality of first contact layer patterns, and wherein each of the plurality of second wiring patterns include a second contact metal interconnecting at least two of the plurality of second contact layer patterns.

The addressable VCSEL array device may further include a substrate, a plurality of first contact layer patterns disposed on the substrate, a plurality of the DBRs disposed on the plurality of first contact layer patterns, a plurality of the gain layers disposed on the plurality of DBRs, a plurality of second contact layer patterns disposed on the plurality of gain layers, a plurality of the nanostructure reflectors disposed on the plurality of second contact layer patterns, wherein each of the plurality of first wiring patterns include a first contact metal interconnecting at least two of the plurality of first contact layer patterns, and wherein each of the plurality of second wiring patterns include a second contact metal interconnecting at least two of the plurality of second contact layer patterns.

The addressable VCSEL array device, wherein at least one of a thickness, a width, and an arrangement distance of the plurality of nanostructures included in the nanostructure reflector may have a value of ½ or less of an oscillation wavelength of the plurality of VCSELs.

The addressable VCSEL array device, wherein a size and an arrangement of the plurality of nanostructures are determined such that the nanostructure reflector is configured to act as a concave mirror with respect to the gain layer corresponding to the nanostructure reflector.

The addressable VCSEL array device, wherein a reflectance of the DBR may be higher than a reflectance of the nanostructure reflector.

The addressable VCSEL array device, wherein the gain layer may include a III-V semiconductor material or a II-VI semiconductor material.

The addressable VCSEL array device may further include a first driver electrically connected to the plurality of first wiring patterns, and a second driver electrically connected to the plurality of second wiring patterns.

The plurality of VCSELs may include a first VCSEL and a second VCSEL, and wherein at least one of an oscillation wavelength and a polarization characteristic of the first VCSEL and the second VCSEL may be different.

The addressable VCSEL array device, wherein a plurality of first VCSELs and a plurality of second VCSELs may be disposed in a plurality of columns and a plurality of rows, respectively, and wherein the plurality of columns of the plurality of first VCSELs and the plurality of rows of the plurality of second VCSELs may be alternately arranged.

The addressable VCSEL array device, wherein a plurality of first VCSELs and a plurality of second VCSELs may be disposed in a plurality of columns and a plurality of rows, respectively, wherein the plurality of first VCSELs and the plurality of second VCSELs may be alternately arranged in each column, and wherein the plurality of first VCSELs and the plurality of second VCSELs are alternately arranged in each row.

According to an aspect of an example embodiment, there is provided an electronic apparatus, the electronic apparatus including an addressable vertical cavity surface emitting laser (VCSEL) array device including a plurality of VCSELs, each of the plurality of VCSELs including a distributed Bragg reflector (DBR), a nanostructure reflector, and a gain layer disposed between the DBR and the nanostructure reflector, wherein the nanostructure reflector includes a plurality of nanostructures having a sub-wavelength dimension, a plurality of first wiring patterns extending in a first direction and being electrically connected to the plurality of VCSELs, respectively, and a plurality of second wiring patterns extending in a second direction intersecting the first direction and being electrically connected to the plurality of VCSELs, respectively, and wherein the plurality of VCSELs are disposed at intersections of the plurality of first wiring patterns and the plurality of second wiring patterns, and wherein the addressable VCSEL array device is configured to selectively drive at least some of the plurality of VCSELs.

The electronic apparatus may be a light source apparatus.

The electronic apparatus may further include a light source including the addressable VCSEL array device, and a sensor configured to detect light reflected by an object that is irradiated with light emitted from the light source.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
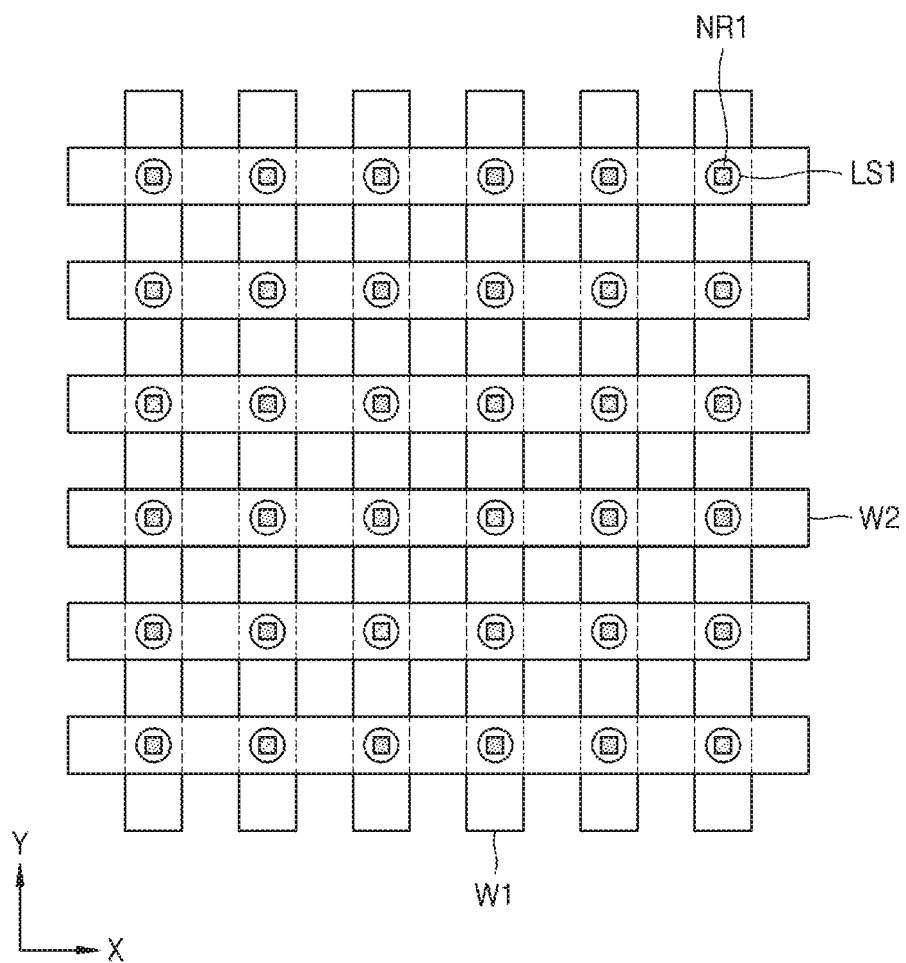
FIG. 1 is a plan view showing an addressable vertical cavity surface emitting laser (VCSEL) array device according to an example embodiment.

Various example embodiments will now be described more fully with reference to the accompanying drawings in which example embodiments are shown.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, addressable laser array devices including a plurality of vertical cavity surface emitting lasers (VCSELs) adopting a nanostructure reflector and electronic apparatuses including the addressable laser array devices according to example embodiments will be described with reference to the accompanying drawings. Throughout the drawings, like reference numerals refer to like elements, and each element may be exaggerated in size for clarity and convenience of a description.

FIG. 1 is a plan view showing an addressable VCSEL array device according to an example embodiment.

Referring to FIG. 1, a plurality of first wiring patterns W1 extending in a first direction and parallel to each other, and a plurality of second wiring patterns W2 extending in a second direction intersecting with the first direction and parallel to each other may be provided. For example, the plurality of first wiring patterns W1 may extend in a Y-axis direction, and the plurality of second wiring patterns W2 may extend in an X-axis direction. Therefore, the plurality of first wiring patterns W1 and the plurality of second wiring patterns W2 may be mutually orthogonal. The plurality of second wiring patterns W2 may be disposed on the plurality of first wiring patterns W1.

A plurality of VCSELs LS1 may be disposed at intersections of the plurality of first wiring patterns W1 and the plurality of second wiring patterns W2. Each of the plurality of VCSELs LS1 may include a nanostructure reflector NR1. The nanostructure reflector NR1 may include a plurality of nanostructures having a sub-wavelength dimension, where a thickness or a width, which defines a shape of the nanostructure reflector NR1, may be less than an operating wavelength of the nanostructure reflector NR1. Each of the plurality of VCSELs LS1 may further include a gain layer and a distributed Bragg reflector (DBR). The gain layer may be disposed between the nanostructure reflector NR1 and the DBR.

The plurality of first wiring patterns W1 may have a first electrical connection structure with respect to the plurality of VCSELs LS1. The plurality of second wiring patterns W2 may have a second electrical connection structure with respect to the plurality of VCSELs LS1. At least some of the plurality of first wiring patterns W1 may be selectively driven and at least some of the plurality of second wiring patterns W2 may be selectively driven, and thus selective driving may be performed with respect to at least some of the plurality of VCSELs LS1.

Figure 2:
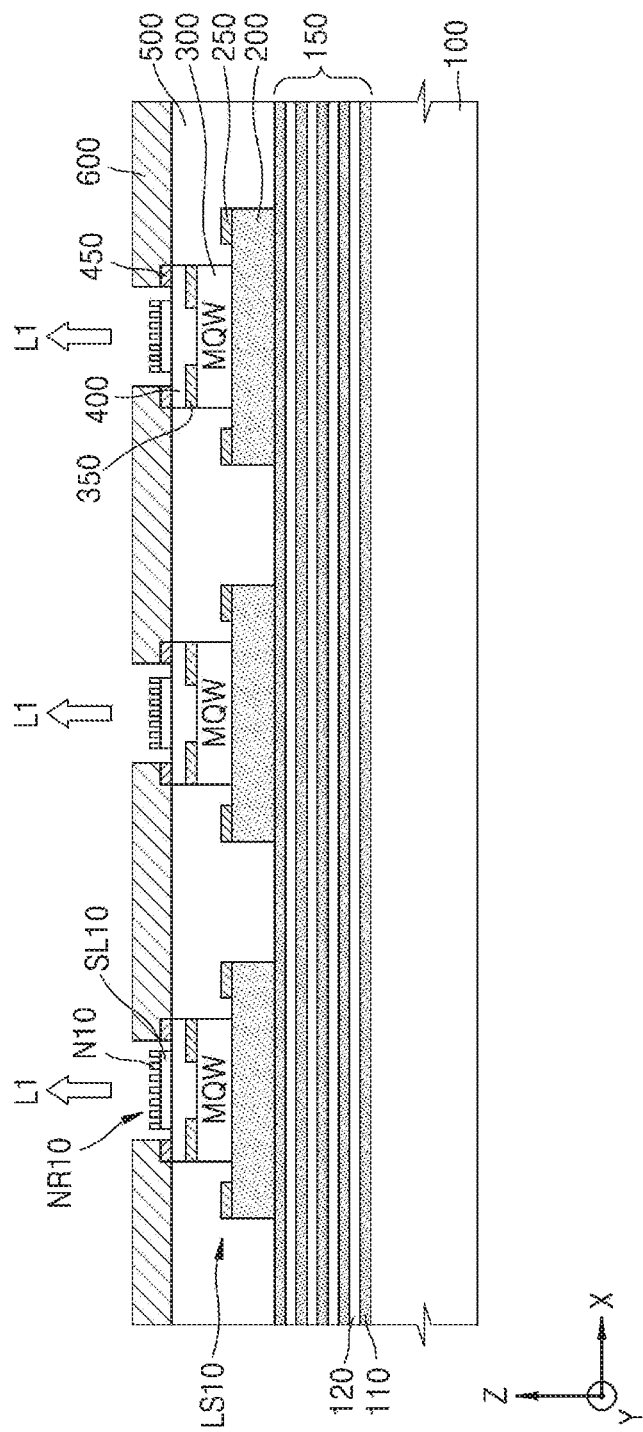
FIG. 2 is a cross-sectional view showing an addressable VCSEL array device according to an example embodiment.

FIG. 2 is a cross-sectional view illustrating an addressable VCSEL array device according to an example embodiment.

Referring to FIG. 2, a plurality of VCSELs LS10 may be provided on a substrate 100. The VCSEL LS10 may include a gain layer 300 that generates light, a DBR 150 that is disposed under/below the gain layer 300, and a nanostructure reflector NR10 that is disposed above/on the gain layer 300.

The substrate 100 may be a semiconductor substrate. The DBR 150 may be formed on the substrate 100. The DBR 150 may be formed by alternately laminating (stacking) a first material layer 110 and a second material layer 120 having different refractive indexes to a thickness of about ¼ of a predetermined oscillation wavelength (i.e., lasing wavelength). A reflectance of the DBR 150 may be set to a predetermined value by adjusting a difference in a refractive index between the first and second material layers 110 and 120 of the DBR 150 and the number of times a pair of the first and second material layers 110 and 120 is repeatedly laminated. The DBR 150 may include a material that is the same as or similar to the semiconductor material that constitutes the gain layer 300. For example, the first material layer 110 may include an $Al_xGa_{(1-x)}As$ layer (x is 0≤x≤1) and the second material layer 120 may include an $Al_yGa_{(1-y)}As$ layer (y is 0≤y≤1, x≠y), but example embodiments are not limited thereto. The two material layers, that is, the first and second material layers 110 and 120, of the DBR 150 may be undoped layers, but, according to example embodiments, may be doped layers to be of a predetermined semiconductor type. The material of the DBR 150 is not limited to that described above, and the first material layer 110 and the second material layer 120 may include various materials capable of forming the difference in the refractive index. The DBR 150 may be a flat plate type mirror layer and may have a plate type structure to cover regions where the plurality of VCSELs LS10 are formed. The DBR 150 may be a common first mirror layer for the plurality of VCSELs LS10.

A plurality of contact layer patterns 200 extending in a first direction, for example, the Y-axis direction, may be disposed on the DBR 150. The plurality of contact layer patterns 200 may have a line shape extending in the Y-axis direction. The plurality of contact layer patterns 200 may include a doped semiconductor material. The plurality of contact layer patterns 200 may include a semiconductor material that is the same as or similar to the DBR 150 and may be doped with a predetermined dopant. The plurality of contact layer patterns 200 may include, for example, an n-type doped layer. However, example embodiments are note limited thereto, and according to an example embodiment, the plurality of contact layer patterns 200 may include a p-type doped layer.

A plurality of gain layers 300 may be disposed on each of the contact layer patterns 200. The gain layer 300 may include a layer that absorbs energy to generate light. The gain layer 300 may generate light, for example, by current injection or pumping light. The gain layer 300 may include an active layer including a semiconductor material. The active layer may include, for example, a III-V semiconductor material or a II-VI semiconductor material. As a specific example, the active layer may include a multi-quantum well (MQW) structure including indium gallium arsenide (InGaAs), aluminum gallium arsenide (AlGaAs), aluminum gallium nitride (AlGaN), indium gallium arsenide phosphide (InGaAsP), indium gallium phosphide (InGaP), aluminum gallium indium phosphide (AlGaInP), etc. In addition, the active layer may include a quantum dot. The material or a configuration of the active layer is not limited to the above example and may vary. The gain layer 300 may further include a first clad layer and a second clad layer provided on lower and upper portions of the active layer, respectively. The first clad layer and the second clad layer may each include an n-type or p-type or intrinsic semiconductor material. The first clad layer and the second clad layer may include the same semiconductor material as the active layer and may further include an n-type dopant or a p-type dopant.

The nanostructure reflector NR10 may be disposed on each gain layer 300. The nanostructure reflector NR10 and the DBR 150 disposed at the upper and lower portions of the gain layer 300 respectively may oscillate the light generated in the gain layer 300 to amplify and emit light of a specific wavelength band. For example, the reflectance of the DBR 150 and the nanostructure reflector NR10 may be set to about 90% or more. The reflectance of the DBR 150 may be higher than the reflectance of the nanostructure reflector NR10. For example, the reflectance of the DBR 150 may be set to about 98% or more such that light is emitted through the nanostructure reflector NR10. According to example embodiments, the reflectance of the DBR 150 and the nanostructure reflector NR10 may be adjusted such that a direction in which the light is emitted is reversed.

The nanostructure reflector NR10 may include a plurality of nanostructures N10 having a sub-wavelength dimension, where a thickness or a width, which defines a shape of the nanostructure reflector NR10, may be less than an operating wavelength of the nanostructure reflector NR10. The operating wavelength of the nanostructure reflector NR10 may be within a wavelength band of the light generated by the gain layer 300. The operating wavelength of the nanostructure reflector NR10 may be a wavelength λ of light L1 oscillated between the DBR 150 and the nanostructure reflector NR10 and emitted among the light generated by the gain layer 300, which may be an oscillation wavelength (lasing wavelength).

The plurality of nanostructures N10 may include a material having a refractive index that is greater than that of a surrounding material (for example, air), and may reflect light of a predetermined wavelength band according to its dimensions, specific shape, etc. The plurality of nanostructures N10 may configure a kind of a meta-structure. At least one of a thickness, a width, and an arrangement interval (i.e. a pitch) of the plurality of nanostructures N10 may be half or less than half of the oscillation wavelength λ. When the width of the nanostructure N10 is less than half of the oscillation wavelength λ, the nanostructure N10 may operate as a stronger scattering unit forming the meta-structure. As the arrangement interval decreases to be less than the wavelength, the nanostructure N10 may control light incident without higher diffraction in a wanted shape. When the thickness of the nanostructure N10 is half or less than half of the oscillation wavelength λ, the nanostructure N10 may operate as the nanostructure reflector NR10 having a high reflection characteristic, but a required thickness is not limited thereto.

The plurality of nanostructures N10 may include a dielectric material or a semiconductor material. The nanostructure N10 may include, for example, any one of single crystal silicon (Si), poly-crystalline Si, amorphous Si, silicon nitride ($Si_3N_4$), gallium phosphide (GaP), titanium dioxide ($TiO_2$), aluminum antimonide (AlSb), aluminum arsenide (AlAs), AlGaAs, AlGaInP, boron phosphide (BP), and zinc germanium phosphide ($ZnGeP_2$). According to an example embodiment, the plurality of nanostructures N10 may include a conductive material. As the conductive material, a highly conductive metal material capable of causing surface plasmon excitation may be employed. For example, at least one selected from among copper (Cu), aluminum (Al), nickel (Ni), iron (Fe), cobalt (Co), zinc (Zn), titanium (Ti), ruthenium (Ru), rhodium (Rh), palladium (Pd), platinum (Pt), silver (Ag), osmium (Os), iridium (Ir), and gold (Au) may be employed and an alloy including any one of these may be employed. In addition, a conductive two-dimensional material, such as graphene, or a conductive oxide may be employed. According to an example embodiment, some of the plurality of nanostructures N10 may include a dielectric material having a high refractive index, and the others may include a conductive material.

The nanostructure reflector NR10 may include a support layer SL10 supporting the plurality of nanostructures N10. The support layer SL10 may include a material having a refractive index that is less than the refractive index of the nanostructure N10. For example, the support layer SL10 may include silicon dioxide ($SiO_2$), transparent conductive oxide (TCO), or polymers such as polycarbonate (PC), polystyrene (PS), and polymethyl methacrylate (PMMA). The material of the support layer SL10 is not limited thereto, and, in according to example embodiments, may include a semiconductor material. The support layer SL10 and the nanostructure N10 may include the same or similar semiconductor material. For example, both of the support layer SL10 and the nanostructure N10 may include a III-V semiconductor compound. Further, the refractive index of the support layer SL10 may be less than the refractive index of the nanostructure N10 by controlling a composition ratio of the compound. A difference in the refractive index between the support layer SL10 and the nanostructure N10 may be about 0.5 or more.

A thickness of the support layer SL10 may be set to be ⅕ or more of the oscillation wavelength λ. When the thickness of the support layer SL10 is less than ⅕ of the oscillation wavelength λ, since light resonating in the nanostructure N10 on the support layer SL10 may be coupled to a lower layer made of the semiconductor material, a desired operation as the meta-structure may not be performed.

The VCSEL LS10 may further include an aperture layer 350 for adjusting a mode of the emitted light or adjusting a beam size. The aperture layer 350 may include a predetermined oxide. In this regard, a position of the aperture layer 350 is shown above the gain layer 300, but is not limited thereto. For example, the position of the aperture layer 350 may be disposed below the gain layer 300. In addition, a plurality of aperture layers 350 may be provided or the aperture layer 350 may be omitted. An insertion layer 400 in contact with the gain layer 300 may be further provided on the aperture layer 350. The insertion layer 400 may include a semiconductor material that is the same as or similar to the gain layer 300. The insertion layer 400 may be doped with a predetermined impurity. The insertion layer 400 may be a layer doped with an impurity of a different type from the contact layer pattern 200. For example, when the contact layer pattern 200 is an n-type layer, the insertion layer 400 may be a p-type layer. The contact layer pattern 200 may be a first contact layer, and the insertion layer 400 may be a second contact layer.

The addressable VCSEL array device according to an example embodiment may further include a plurality of first wiring patterns 250 disposed on the plurality of contact layer patterns 200. Each of the first wiring patterns 250 may be disposed on the respective contact layer patterns 200 to be spaced apart from the gain layer 300. The first wiring pattern 250 may be electrically connected to a lower surface of the gain layer 300 through the contact layer pattern 200. Similar to the contact layer pattern 200, the first wiring pattern 250 may have a structure extending in the Y-axis direction. In addition, the addressable VCSEL array device may further include a plurality of second wiring patterns 600 disposed above the plurality of gain layers 300. The plurality of second wiring patterns 600 may have a line shape extending, for example, in the X-axis direction. Here, although one second wiring pattern 600 is shown, the plurality of second wiring patterns 600 spaced in the Y-axis direction may be arranged in the X-axis direction. The second wiring pattern 600 may be electrically connected to an upper surface of the gain layer 300 through the insertion layer 400. The plurality of first wiring patterns 250 may extend in the Y-axis direction. The plurality of second wiring patterns 600 may extend in the X-axis direction. The plurality of VCSELs LS10 may be arranged at the intersections of the plurality of first wiring patterns 250 and the plurality of second wiring patterns 600.

An insulating passivation layer 500 filling a space between the plurality of VCSELs LS10 may be further provided on the DBR (i.e., a flat type mirror layer 150). The passivation layer 500 may be disposed to cover the plurality of contact layer patterns 200 and the plurality of first wiring patterns 250. The plurality of second wiring patterns 600 may be disposed on the passivation layer 500. The passivation layer 500 may include, for example, an inorganic insulating material such as silicon oxide and silicon nitride, or an organic insulating material (polymer) such as benzocyclobutene (BCB). However, the material of the passivation layer 500 is not limited thereto and may be variously changed.

In addition, the addressable VCSEL array device according to an example embodiment may further include a ring type electrode 450 disposed on the insertion layer 400, and the second wiring pattern 600 may be formed to electrically contact the ring type electrode 450. In this example, the second wiring pattern 600 may be seen as being electrically connected to the gain layer 300 through the ring type electrode 450 and the insertion layer 400. The ring type electrode 450 may not be provided.

The plurality of first wiring patterns 250 and the second wiring patterns 600 may include metals or alloys such as Au, Cu, and Al, but are not limited thereto. A current may be injected into the plurality of VCSELs LS10, through the plurality of first wiring patterns 250 and second wiring patterns 600, and predetermined emission light (a laser) L1 may be emitted.

Figure 3:
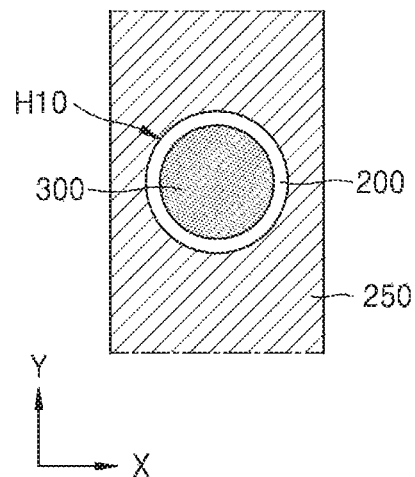
FIG. 3 is a plan view showing a structure of a first wiring pattern applicable to an addressable VCSEL array device according to an example embodiment.

FIG. 3 is a plan view of a structure of the first wiring pattern 250 applicable to an addressable VCSEL array device according to an example embodiment.

Referring to FIG. 3, the first wiring pattern 250 may be provided on the contact layer pattern 200. The first wiring pattern 250 may have a first opening H10 that exposes the contact layer pattern 200. The gain layer 300 spaced apart from the first wiring pattern 250 may be provided in the first opening H10. The first opening H10 may be circular, but is not limited thereto, and may have various shapes such as an ellipse, a square, a rectangle, etc. A shape of the gain layer 300 may also be modified. The first wiring pattern 250 may have the structure extending in the Y-axis direction similar to the contact layer pattern 200, and may further include a first opening H10.

Figure 4:
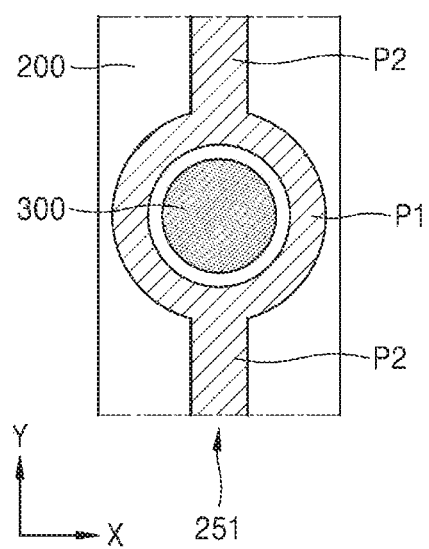
FIG. 4 is a plan view showing a structure of a first wiring pattern applicable to an addressable VCSEL array device according to an example embodiment.
Figure 5:
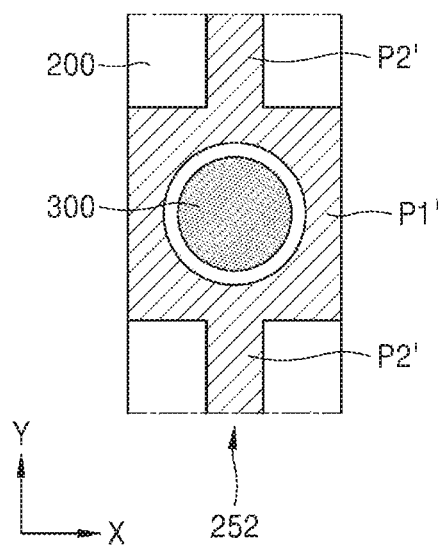
FIG. 5 is a plan view showing a structure of a first wiring pattern applicable to an addressable VCSEL array device according to an example embodiment.

According to an example embodiment, a planar structure of the first wiring pattern 250 may be variously changed and examples thereof are shown in FIGS. 4 and 5.

Referring to FIG. 4, a first wiring pattern 251 may include a first pattern portion P1 surrounding the gain layer 300 and a second pattern portion P2 extending from both ends of the first pattern portion P1. The second pattern portion P2 may have a smaller width than the first pattern portion P1. The first pattern portion P1 may have a circular structure having an opening region at the center thereof.

Referring to FIG. 5, a first wiring pattern 252 may include a first pattern portion P1' surrounding the gain layer 300 and a second pattern portion P2' extending from both ends of the first pattern portion P1'. The first pattern portion P1' may have a rectangular structure having an opening region at the center thereof.

The characteristics of a current supplied to the gain layer 300 may be changed according to shapes and sizes of the first pattern portions P1 and P1' surrounding the gain layer 300 in FIGS. 4 and 5. Therefore, the characteristics of a VCSEL may be adjusted according to the shapes and sizes of the first pattern portions P1 and P1'. The first pattern portions P1 and P1' may have an anisotropic structure such as an ellipse or a rectangle, or may have an asymmetric structure.

In FIGS. 3 to 5, the conductive patterns 250, 251, and 252 formed on the contact layer pattern 200 are the first wiring patterns. However, in some examples, a lamination structure of the contact layer pattern 200 and the conductive pattern 250, 251 or 252 may be a first wiring pattern.

Figure 6:
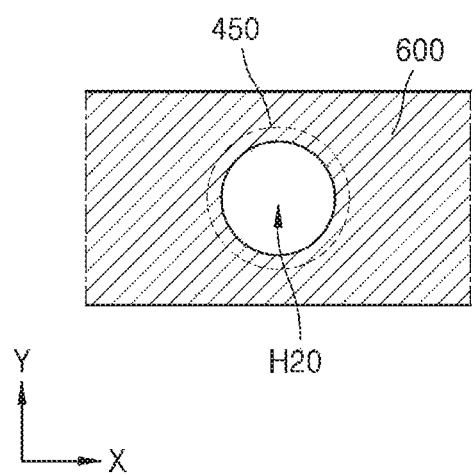
FIG. 6 is a plan view showing a structure of a second wiring pattern applicable to an addressable VCSEL array device according to an example embodiment.

FIG. 6 is a plan view for describing a structure of the second wiring pattern 600 applicable to an addressable VCSEL array device according to an example embodiment.

Referring to FIG. 6, the second wiring pattern 600 may have a second opening H20. A nanostructure reflector may be provided in the second opening H20. The nanostructure reflector may be exposed by the second opening H20. The ring type electrode 450 may be provided around the second opening H20 and the second wiring pattern 600 in contact with the ring type electrode 450 may be disposed on the ring type electrode 450. Shapes and sizes of the second opening H20 and the ring type electrode 450 are examples and may vary. For example, the second opening H20 and the ring type electrode 450 may have a rectangular structure. By increasing the size of the ring type electrode 450, a contact margin between the ring type electrode 450 and the second wiring pattern 600 may increase. In some examples, the ring type electrode 450 may not be provided.

Figure 7:
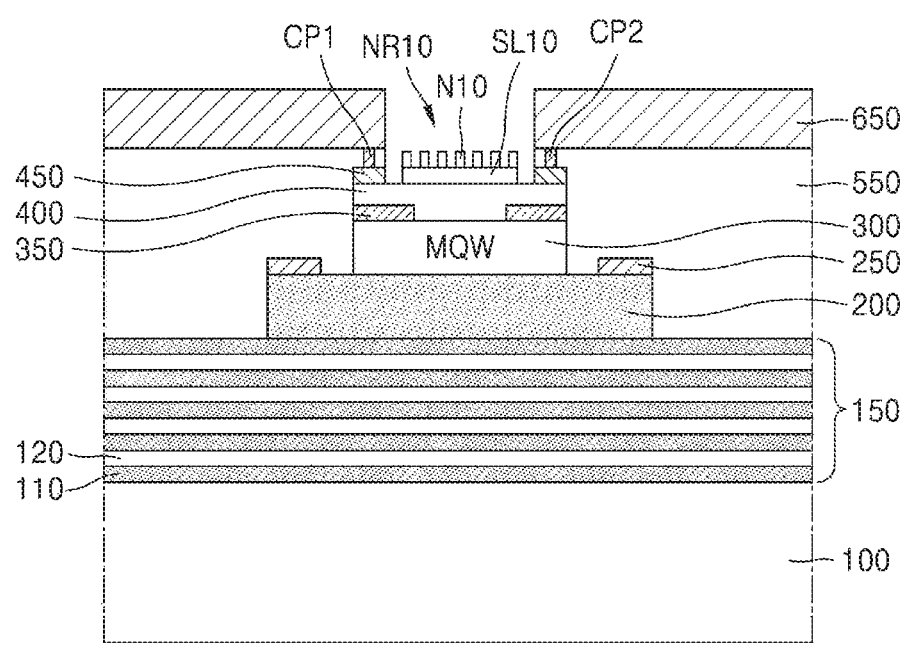
FIG. 7 is a cross-sectional view showing a structure of an addressable VCSEL array element according to an example embodiment.

FIG. 7 is a cross-sectional view of a structure of an addressable VCSEL array element according to an example embodiment.

Referring to FIG. 7, a second wiring pattern 650 may be electrically connected to the ring type electrode 450 through conductive plugs CP1 and CP2 formed in a passivation layer 550. The conductive plugs CP1 and CP2 may include a first conductive plug CP1 and a second conductive plug CP2. According to an example embodiment, only one of the first and second conductive plugs CP1 and CP2 may be used. The second wiring pattern 650 and the ring type electrode 450 may be electrically connected more easily by using the conductive plugs CP1 and CP2. Further, the second wiring pattern 650 and the ring type electrode 450 may be physically separated from each other. The characteristics of current injected into the gain layer 300 may be changed by changing shapes of the ring type electrode 450 and the first wiring pattern 250, and the polarization characteristics of emitted light may be changed.

Figure 8:
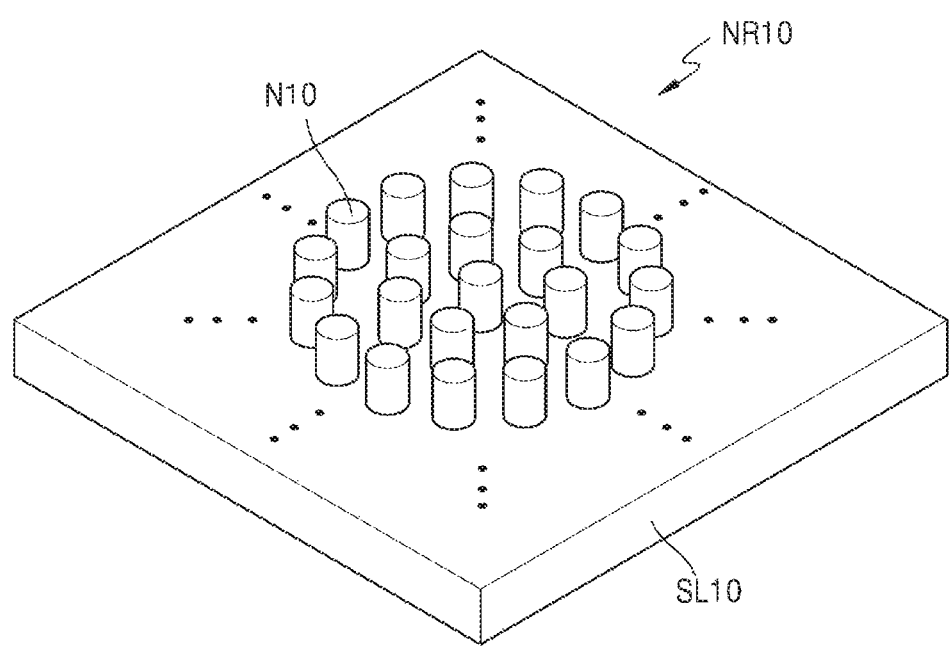
FIG. 8 is a perspective view showing a nanostructure reflector applicable to a VCSEL according to an example embodiment.

FIG. 8 is a perspective view showing a nanostructure reflector NR10 applicable to a VCSEL according to an example embodiment.

Referring to FIG. 8, the nanostructure reflector NR10 may include the support layer SL10 and the plurality of nanostructures N10 provided on the support layer SL10. The nanostructure N10 may have various shapes such as a cylinder, an elliptical column, and a square column. Referring to FIG. 8, an example embodiment where the nanostructure N10 has a cylindrical shape is shown.

Figure 9:
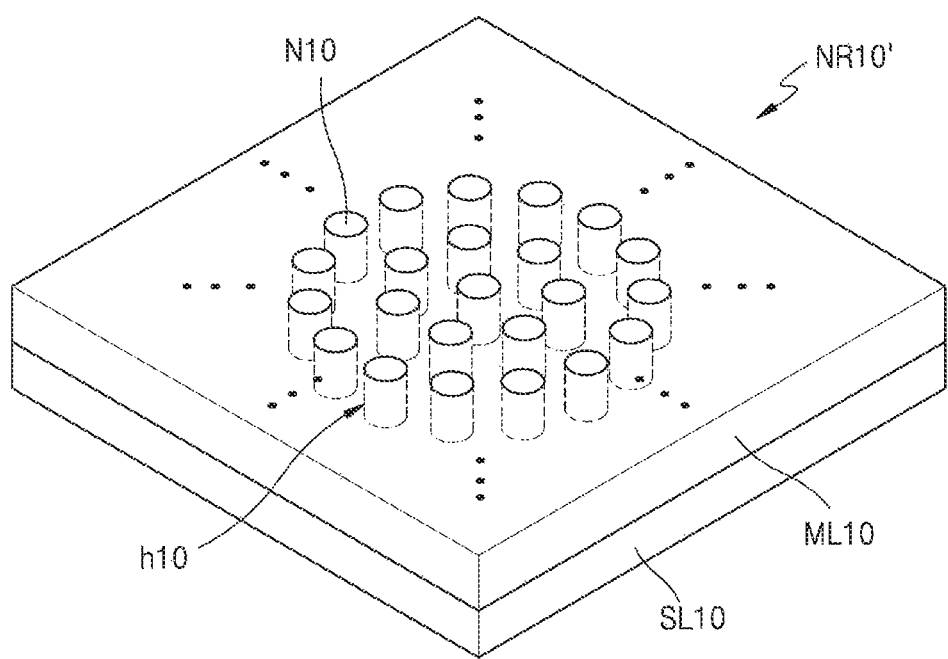
FIG. 9 is a cross-sectional view showing a nanostructure reflector applicable to a VCSEL according to an example embodiment.

FIG. 9 is a cross-sectional view showing a nanostructure reflector NR10' applicable to a VCSEL according to an example embodiment Referring to FIG. 9, the nanostructure reflector NR10' may further include a predetermined material layer ML10 having a plurality of holes h10 on the support layer SL10. The plurality of nanostructures N10 may be disposed in the plurality of holes h10, respectively. A refractive index of the material layer ML10 may be less than the refractive index of the plurality of nanostructures N10. The material layer ML10 may include the same or different material as or from the support layer SL10. The material layer ML10 may be an adjacent layer or a contact layer since the material layer ML10 may be in contact with the periphery of the plurality of nanostructures N10.

Figure 10:
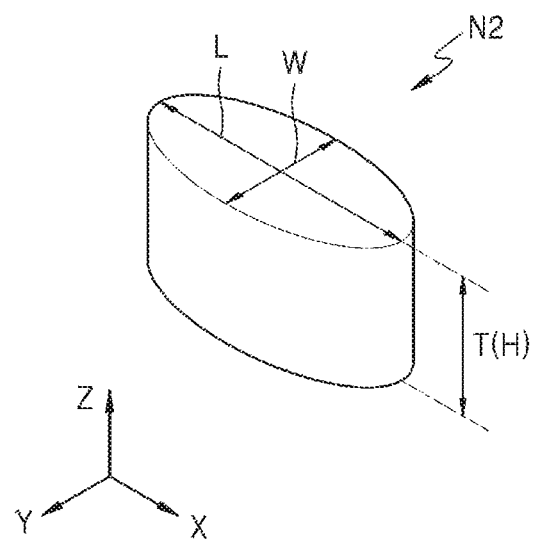
FIG. 10 is a perspective view showing a structure of a nanostructure applicable to a nanostructure reflector according to an example embodiment.

FIG. 10 is a perspective view showing a structure of a nanostructure N2 applicable to a nanostructure reflector according to an example embodiment.

Referring to FIG. 10, the nanostructure N2 may have a major axis in a first direction, e.g., an X-axis direction, and a minor axis in a second direction, e.g., a Y-axis direction, on an XY plane. A dimension in a major axis direction may be a length L. A dimension in a minor axis direction may be a width W. A dimension in a Z-axis direction may be a thickness T or a height H. The length L may be greater than the width W. The nanostructure N2 on the XY plane may have an elliptical or similar shape. Such a nanostructure N2 may have an anisotropic structure.

The width W, the length L, and/or the thickness T of the nanostructure N2 may be ½ or less of the oscillation wavelength λ. Further, when the plurality of nanostructures N2 are regularly arranged, a distance between the centers of the adjacent two nanostructures N2 may be ½ or less of the oscillation wavelength λ.

The anisotropic structure of the nanostructure N2 may be changed in various ways. For example, the nanostructure N2 on the XY plane may have an anisotropic structure of a different shape from an elliptical shape and examples thereof are shown in FIGS. 11 and 12.

Figure 11:
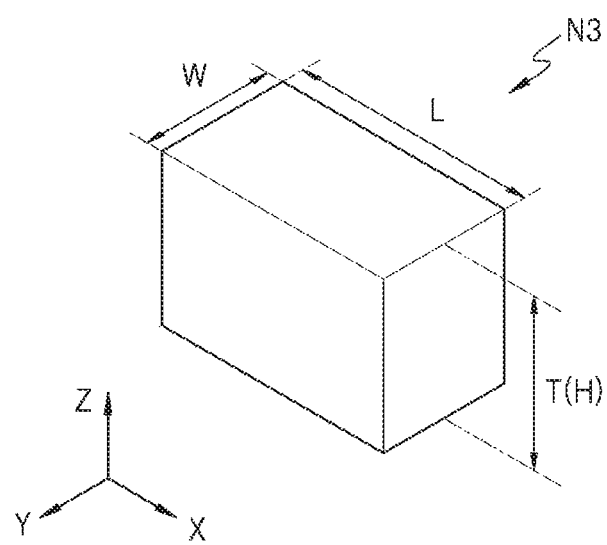
FIG. 11 is a perspective view showing a structure of a nanostructure applicable to a nanostructure reflector according to an example embodiment.

Referring to FIG. 11, a nanostructure N3 may have a quadrangular cylindrical shape. The nanostructure N3 may have a rectangular anisotropic structure on the XY plane.

Figure 12:
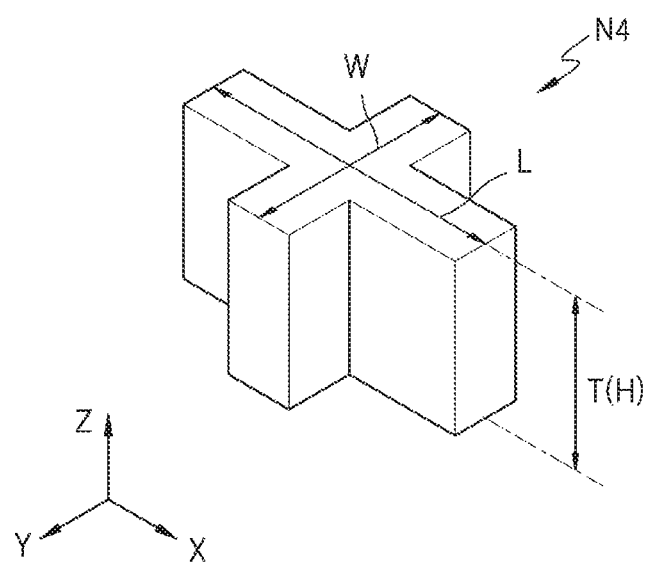
FIG. 12 is a perspective view showing a structure of a nanostructure applicable to a nanostructure reflector according to an example embodiment.

Referring to FIG. 12, a nanostructure N4 may have a cross cylindrical shape. In this example, the length L in the X-axis direction may be greater than the width W in the Y-axis direction. Therefore, the nanostructure N4 may have an anisotropic structure.

As described with reference to FIGS. 10 to 12, when the nanostructures N2, N3 and N4 have an anisotropic structure, a polarization direction of light (emitted light) may be controlled by using respective arrays of the nanostructures N2, N3 and N4. By arranging the nanostructures N2, N3 and N4 having the anisotropic structure in a specific direction, the light (emitted light) may be controlled to have a specific polarization direction. However, the structures of the nanostructures N2, N3 and N4 shown here are examples and may be changed in various ways.

According to example embodiments, the nanostructure reflector may be designed to act as a concave mirror or a convex mirror with respect to a gain layer. In other words, a size distribution and an arrangement rule of a plurality of nanostructures constituting the nanostructure reflector may be designed such that the nanostructure reflector acts as the concave mirror or the convex mirror.

Figure 13:
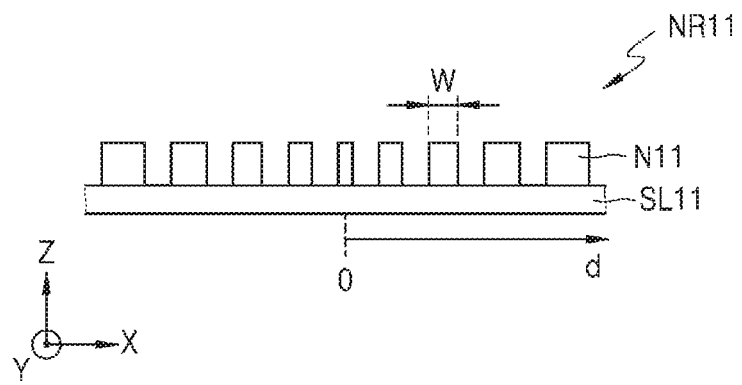
FIG. 13 is a cross-sectional view showing a schematic structure of a nanostructure reflector employable in a VCSEL according to an example embodiment.

FIG. 13 is a cross-sectional view showing a schematic structure of a nanostructure reflector NR11 employable in a VCSEL according to an example embodiment.

Referring to FIG. 13, the nanostructure reflector NR11 may include a support layer SL11 and a plurality of nanostructures N11 formed on the support layer SL11. A size distribution and an arrangement rule of the nanostructures N11 may be set such that the nanostructure reflector NR11 acts as a concave mirror. For example, the width W of the plurality of nanostructures N11 may increase away from a center of the nanostructure reflector NR11 by a predetermined distance d. When a position of the nanostructure N11 is defined as a distance from the center of the nanostructure reflector NR11 in a radial direction, the width W of the nanostructure N11 at a given position may be determined as a specific value such that the nanostructure reflector NR11 operates as the concave mirror. The width W of the nanostructure N11 may increase in the radial direction within a predetermined range from the center thereof.

Figure 14:
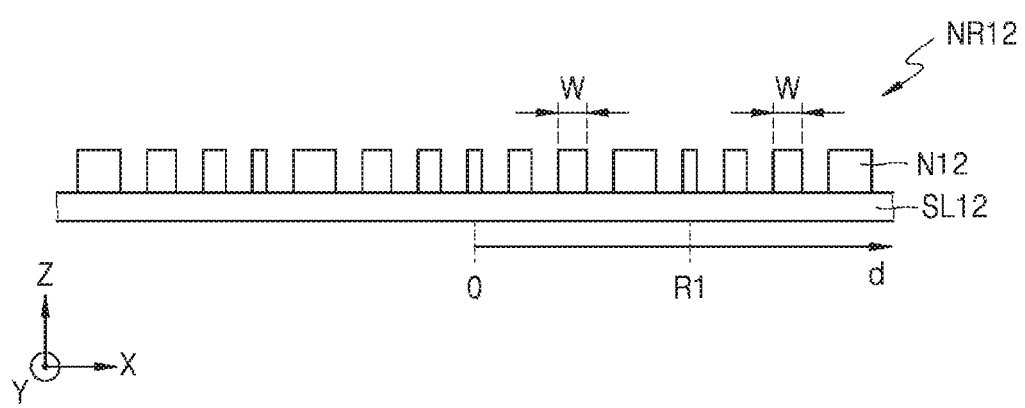
FIG. 14 is a cross-sectional view showing a schematic structure of a nanostructure reflector employable in a VCSEL according to an example embodiment.

A variation rule of the width W of the nanostructure N11 described in FIG. 13 may be repeated in the radial direction and an example thereof is shown in FIG. 14.

Referring to FIG. 14, a nanostructure reflector NR12 may include a support layer SL12 and a plurality of nanostructures N12. The width W of the plurality of nanostructures N12 may increase away from a center of the nanostructure reflector NR12 according to a predetermined rule. The nanostructure reflector NR12 may split into a plurality of regions in a direction away from the center thereof according to distance. The width W of the plurality of nanostructures N12 may increase away from the center in each of the plurality of regions. Here, it is shown that the width W increases from the center (d=0) to an R1 position and the width W increases again as the distance d increases from the R1 position. A period in which the rule of increasing the width W is repeated may not be constant but may be changed. Such a nanostructure reflector NR12 may act as a concave mirror.

When the nanostructure reflectors NR11 and NR12 act as concave mirrors, the intensity of emitted light oscillated from the VCSEL may be enhanced and a wavefront profile may be controlled. The optical characteristics of the nanostructure reflectors NR11 and NR12 may be controlled by adjusting the size distribution and the arrangement rule of a plurality of nanostructures constituting the nanostructure reflectors NR11 and NR12, and consequently, enabling beam forming and beam shaping of the emitted light.

Figure 15:
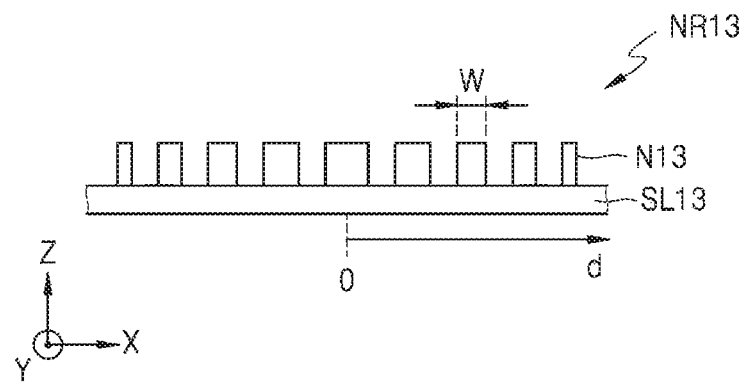
FIG. 15 is a cross-sectional view showing a schematic structure of a nanostructure reflector employable in a VCSEL according to an example embodiment.

FIG. 15 is a cross-sectional view showing a schematic structure of a nanostructure reflector NR13 employable in a VCSEL according to an example embodiment.

Referring to FIG. 15, the nanostructure reflector NR13 may include a support layer SL13 and a plurality of nanostructures N13 formed on the support layer SL13. A size distribution and an arrangement rule of the nanostructures N13 may be set such that the nanostructure reflector NR13 acts as a convex mirror. For example, the width W of the plurality of nanostructures N13 may decrease away from a center of the nanostructure reflector NR13 by the predetermined distance d. The width W of the nanostructure N13 may decrease in a radial direction within a predetermined range from the center.

Figure 16:
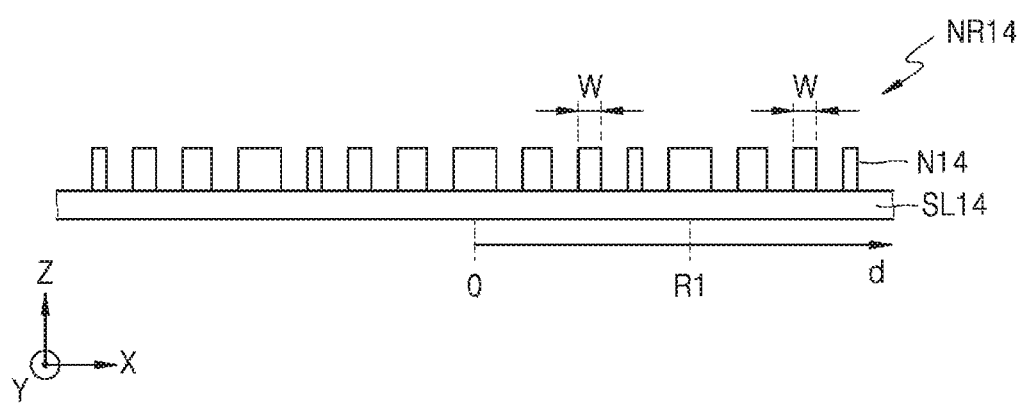
FIG. 16 is a cross-sectional view showing a schematic structure of a nanostructure reflector employable in a VCSEL according to an example embodiment.

A variation rule of the width W of the nanostructure N13 described in FIG. 15 may be repeated in the radial direction and an example thereof is shown in FIG. 16.

Referring to FIG. 16, a nanostructure reflector NR14 may include a support layer SL14 and a plurality of nanostructures N14. The width W of the plurality of nanostructures N14 may decrease away from a center of the nanostructure reflector NR14 according to a predetermined rule. The nanostructure reflector NR14 may split into a plurality of regions according to a distance in a direction away from the center. The width W of the plurality of nanostructures N14 may decrease away from the center in each of the plurality of regions. A period in which the rule of decreasing the width W is repeated may not be constant but may be changed. Such a nanostructure reflector NR14 may act as a convex mirror.

According to an example embodiment, a size and an arrangement of a plurality of nanostructures may be determined such that a nanostructure reflector may perform an operation of oscillating light together with a DBR, and additionally may perform an operation of deflecting emitted light. The arrangement rule and the size distribution may be determined such that a width or size of the plurality of nanostructures gradually decreases or increases in one direction, for example, a horizontal direction. Also, the arrangement may be for one period unit and may be repeated in a horizontal direction. The nanostructure reflector may be employed in the VCSEL and may be variously adjusted such that the optical performance of the emitted light such as a beam diameter, a convergence/divergence shape, a direction, etc. are controlled. Further, the nanostructure reflector may be adjusted such that the polarization direction of the emitted light is controlled.

Figure 17:
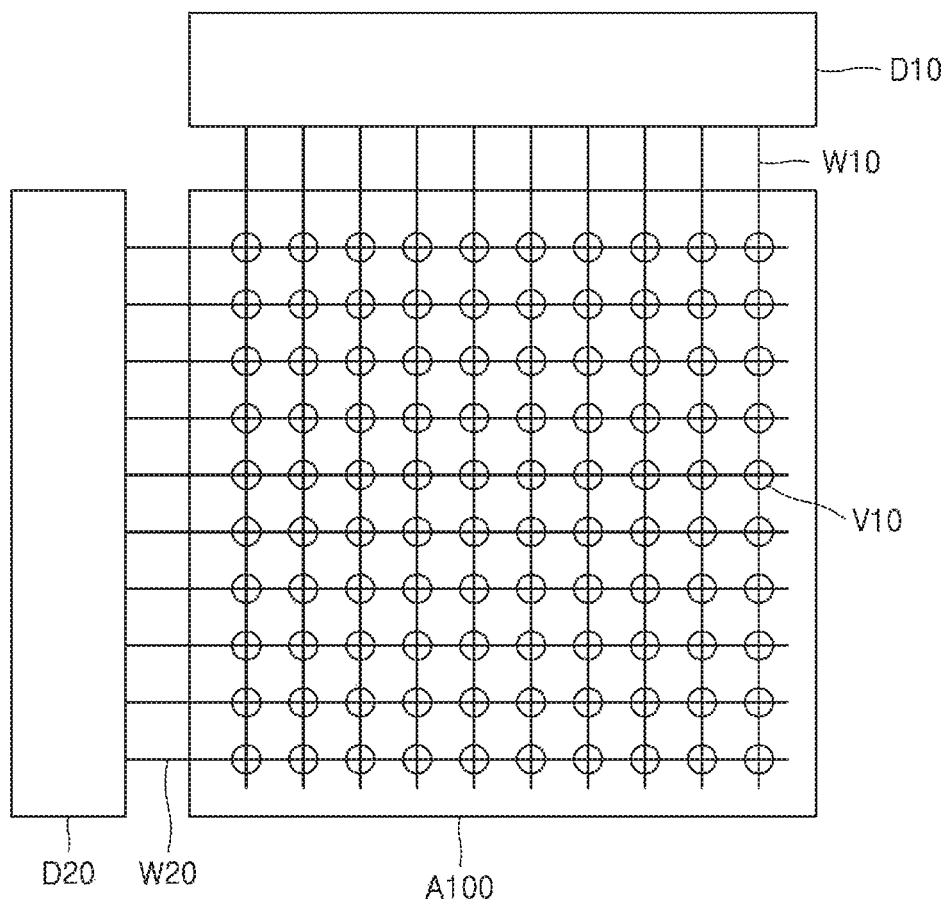
FIG. 17 is a plan view showing an addressable VCSEL array device according to an example embodiment.

FIG. 17 is a plan view showing an addressable VCSEL array device according to an example embodiment.

Referring to FIG. 17, the addressable VCSEL array device may include an active region A100 in which a plurality of VCSELs V10 are arranged. The active region A100 may include a plurality of first wirings W10 and a plurality of second wirings W20 electrically connected to the plurality of VCSELs V10. The VCSEL array device may further include a first driver D10 electrically connected to the plurality of first wirings W10 and a second driver D20 electrically connected to the plurality of second wirings W20.

Figure 18:
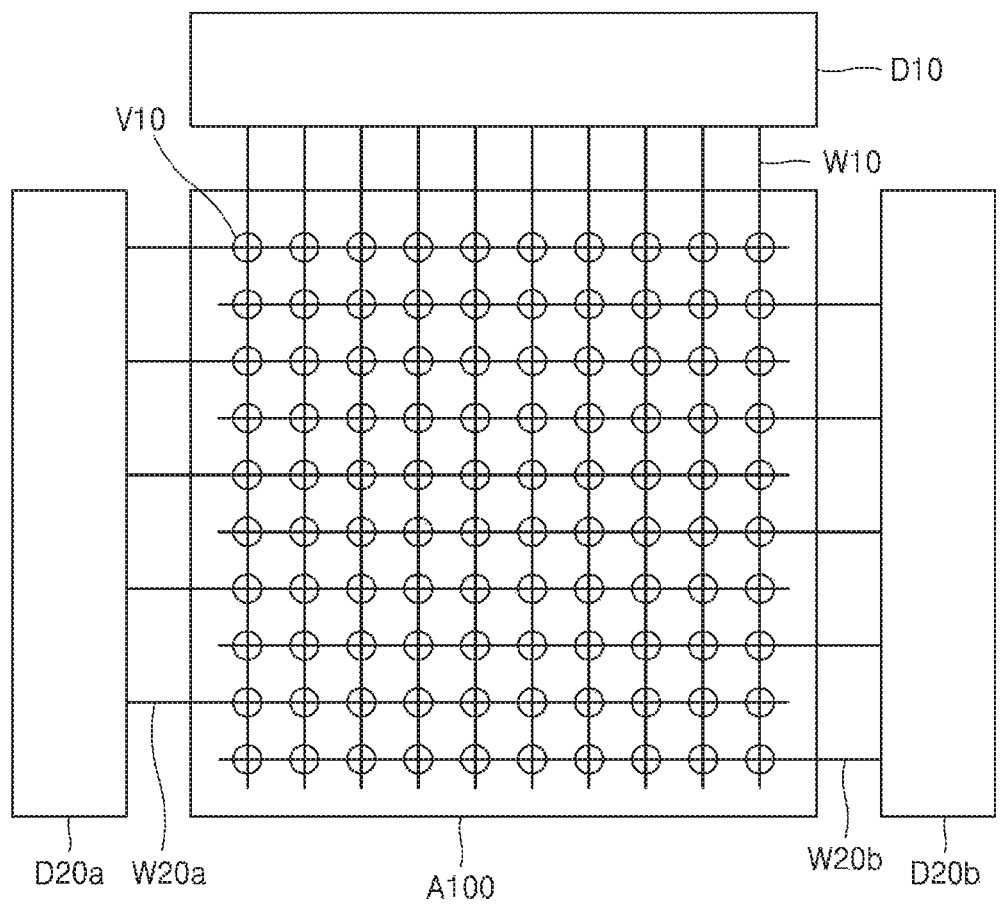
FIG. 18 is a plan view showing an addressable VCSEL array device according to an example embodiment.
Figure 19:
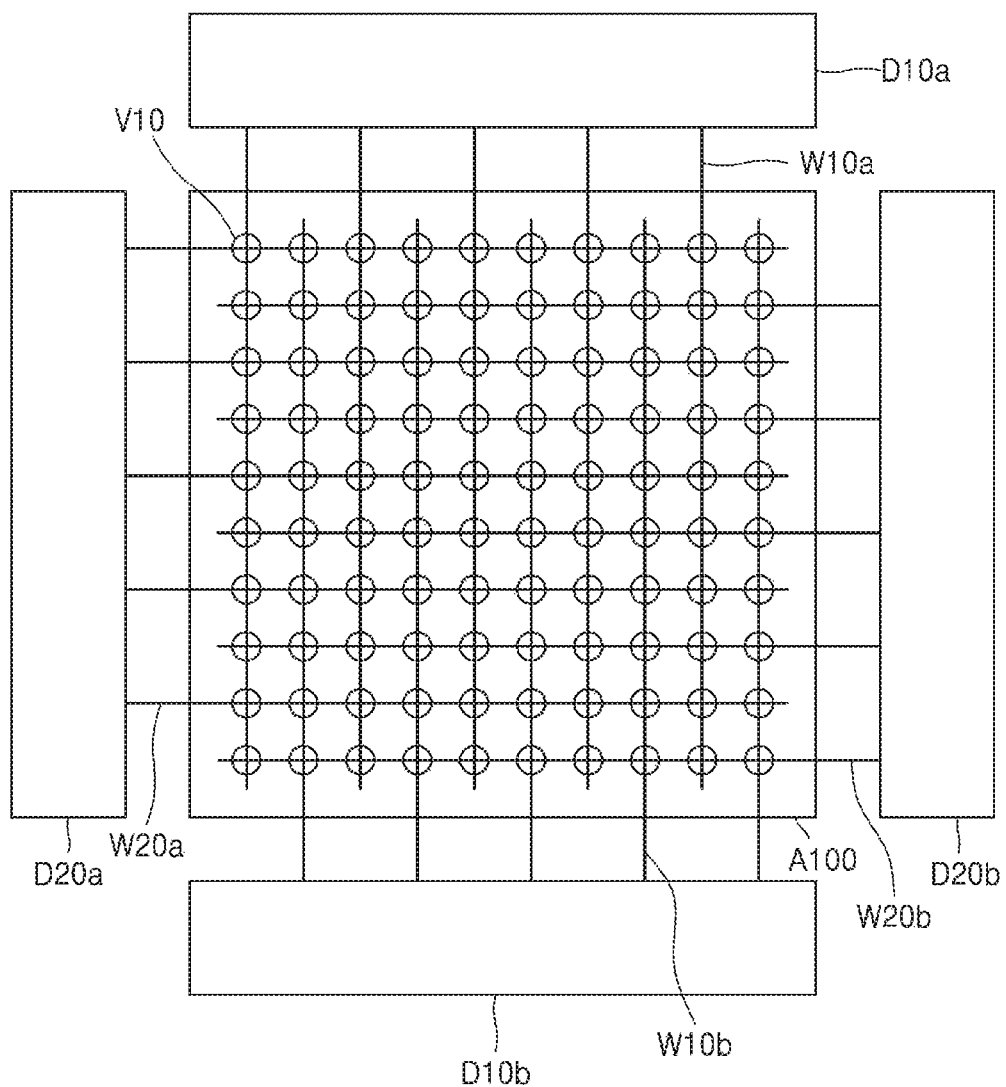
FIG. 19 is a plan view showing an addressable VCSEL array device according to an example embodiment.

FIGS. 18 and 19 are plan views of addressable VCSEL array devices according to example embodiments.

Referring to FIG. 18, a second driver may include a 2-1th driver D20*a* provided on a left side (the left side in the figure) of the active region A100 and a 2-2th driver D20*b* provided on the right side of the active region A100. The 2-1th driver D20*a* may be connected to the active region A100 through a plurality of 2-1th wirings W20*a*. The 2-2th driver D20*b* may be connected to the active region A100 through a plurality of 2-2th wirings W20*b*.

Referring to FIG. 19, a first driver may include a 1-1th driver D10*a* provided on an upper side of the active region A100 and a 1-2th driver D10*b* provided on a lower side of the active region A100. The 1-1th driver D10*a* may be connected to the active region A100 through a plurality of 1-1th wirings W10*a*. The 1-2th driver D10*b* may be connected to the active region A100 through a plurality of 1-2th wirings W10*b*. Further, the 2-1th driver D20*a* and the 2-2th driver D20*b* may be further provided as described with reference to FIG. 18 above.

Figure 20:
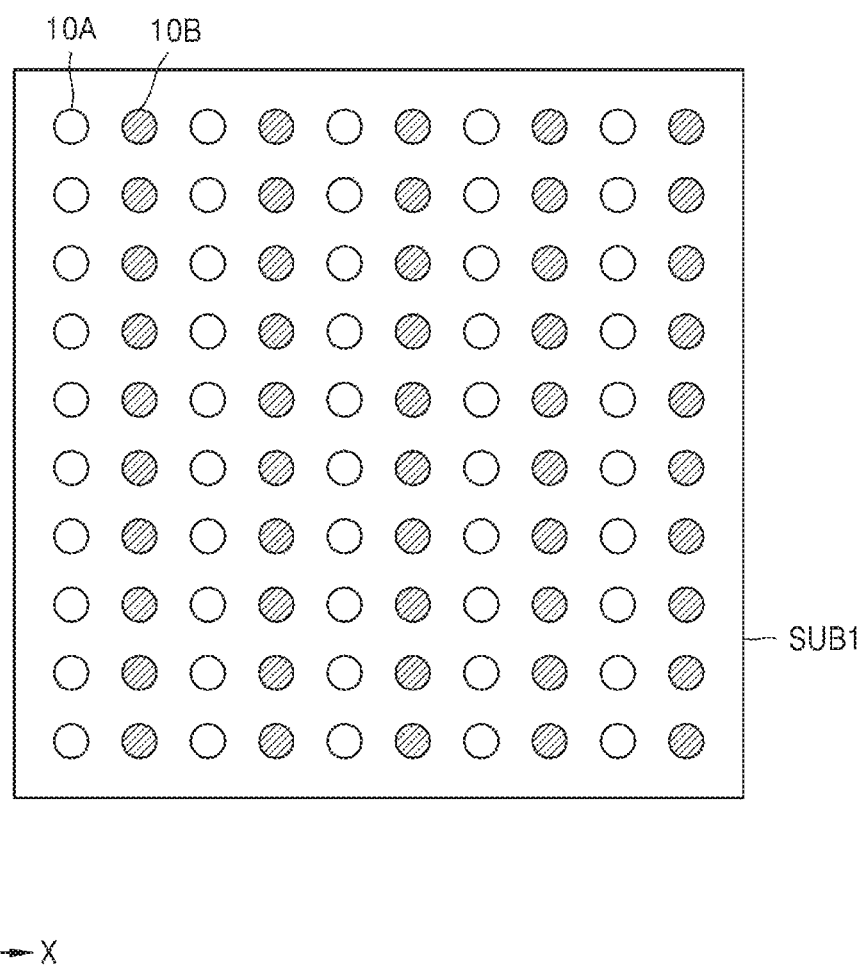
FIG. 20 is a plan view showing a light source including a VCSEL array according to an example embodiment.
Figure 21:
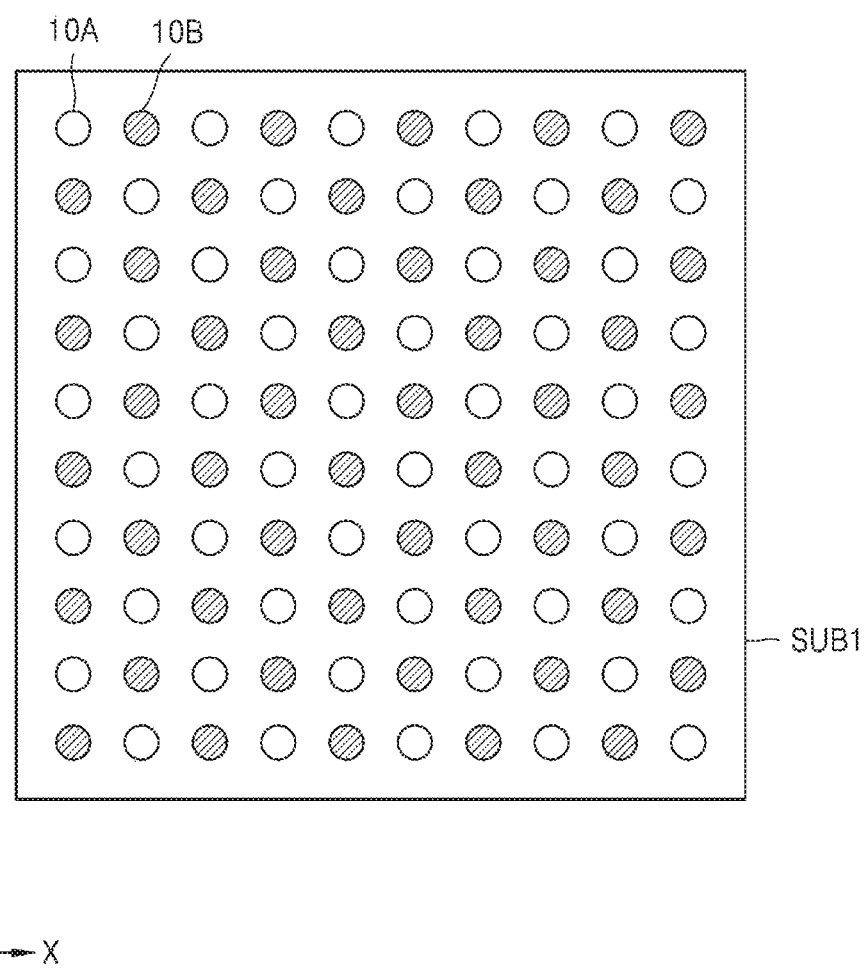
FIG. 21 is a plan view showing a light source including a VCSEL array according to an example embodiment.

According to an example embodiment, at least two types of lasers may be provided in an array on one substrate, and examples thereof are shown in FIGS. 20 and 21.

FIG. 20 is a plan view showing a light source including a VCSEL array according to an example embodiment.

Referring to FIG. 20, a plurality of first VCSELs 10A and a plurality of second VCSELs 10B may be arranged on a substrate SUB1 to form an array. The plurality of first VCSELs 10A may be arranged to form a plurality of columns. The plurality of second VCSELs 10B may be arranged to form a plurality of columns. The columns constituted by the first VCSELs 10A and the columns constituted by the second VCSELs 10B may be arranged alternately. The first VCSELs 10A and the second VCSELs 10B may have different properties in at least one of the oscillation wavelength and polarization properties. Therefore, a configuration of a first nanostructure reflector included in the first VCSELs 10A and a configuration of a second nanostructure reflector included in the second VCSELs 10B may be different from each other.

The plurality of first VCSELs 10A and the plurality of second VCSELs 10B may be controlled independently from each other. Thus, only the plurality of first VCSELs 10A may emit light and the plurality of second VCSELs 10B may not emit light, or only the plurality of second VCSELs 10B may emit light, and the plurality of first VCSELs 10A may not emit light. The plurality of first and second VCSELs 10A and 10B may operate in accordance with a predetermined rule or randomly. If necessary, at least some of the plurality of first VCSELs 10A and at least some of the plurality of second VCSELs 10B may be simultaneously driven. In addition, the array of the plurality of first and second VCSELs 10A and 10B may be sequentially driven in a scanning manner or in a different form.

FIG. 21 is a plan view showing a light source including a VCSEL array according to an example embodiment.

Referring to FIG. 21, the plurality of first VCSELs 10A and the plurality of second VCSELs 10B may be arranged on the substrate SUB1 to form an array. The plurality of first VCSELs 10A and the plurality of second VCSELs 10B may be arranged to form a plurality of columns and rows. The plurality of first VCSELs 10A and the plurality of second VCSELs 10B may be arranged alternately at each column. The plurality of first VCSELs 10A and the plurality of second VCSELs 10B may be arranged alternately at each row. The array method shown there is an example and may be changed in various ways.

Although FIGS. 20 and 21 show the VCSELs 10A and 10B in a circular pattern when viewed from above, this is only an example, and a planar structure of the VCSELs 10A and 10B may be different. For example, the planar structure on the XY plane of at least some of the VCSELs 10A and 10B may have a rectangular or elliptical structure or an anisotropic or asymmetric structure similar thereto, through which the optical properties may be controlled. Further, the array structure described in FIGS. 20 and 21 and configurations of peripheral circuit portions in FIGS. 17 to 19 may be variously combined.

Figure 22:
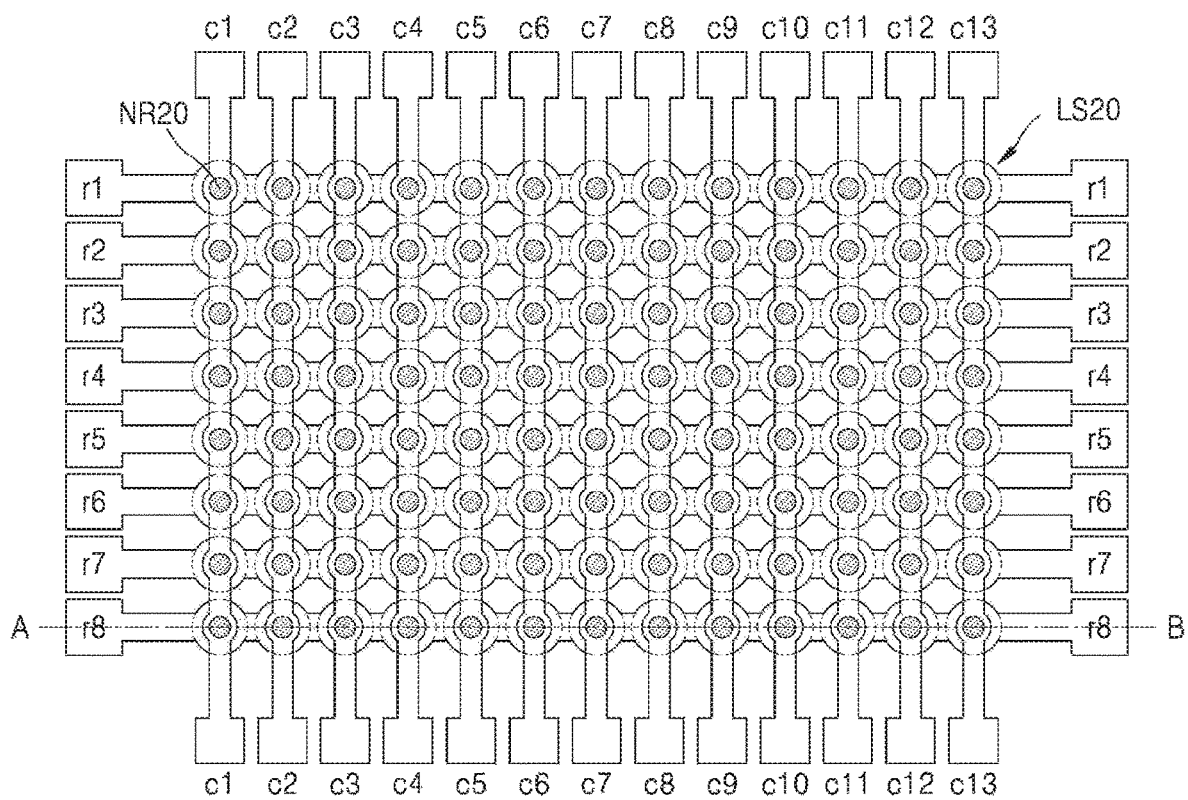
FIG. 22 is a plan view showing an addressable VCSEL array device according to an example embodiment.

FIG. 22 is a plan view showing an addressable VCSEL array device according to an example embodiment.

Referring to FIG. 22, a plurality of first wiring patterns r1 to r8 extending in a first direction and a plurality of second wiring patterns c1 to c13 parallel to each other and extending in a second direction intersecting with the first direction may be provided. The plurality of first wiring patterns r1 to r8 may be row wirings. The plurality of second wiring patterns c1 to c13 may be column wirings. The number of first wiring patterns r1 to r8 and the number of second wiring patterns c1 to c13 are examples and may vary. A plurality of VCSELs LS20 may be arranged at intersections of the plurality of first wiring patterns r1 to r8 and the plurality of second wiring patterns c1 to c13. Each of the plurality of VCSELs LS20 may include a nanostructure reflector NR20.

Figure 23:
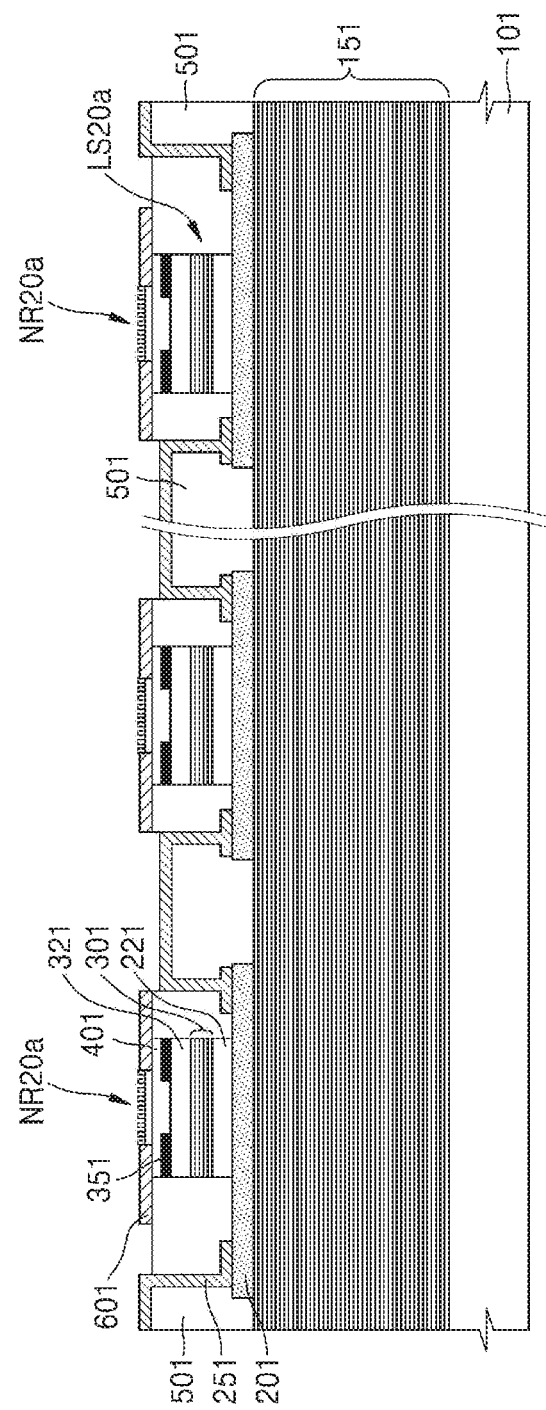
FIG. 23 is a cross-sectional view showing a cross-sectional structure taken along line A-B of FIG. 22 according to an example embodiment.

FIG. 23 is a cross-sectional view showing a cross-sectional structure taken along line A-B of FIG. 22 according to an example embodiment.

Referring to FIG. 23, a plurality of VCSELs LS20*a* may be provided on a substrate 101. The VCSEL LS20*a* may include an active layer 301 generating light, a DBR 151 disposed at an upper portion of the active layer 301, and a nanostructure reflector NR20*a* disposed at a lower portion of the active layer 301.

The DBR 151 may be provided on the substrate 101. The substrate 101 may be, for example, an undoped gallium arsenide (GaAs) substrate, but a material thereof may be different. The DBR 151 may be an undoped DBR. A plurality of first contact layer patterns 201 may be disposed on the DBR 151. The plurality of first contact layer patterns 201 may be patterned in an island shape and arranged two-dimensionally. The plurality of first contact layer patterns 201 may include, for example, an n-type doped layer.

The active layer 301 may be disposed on each of the first contact layer patterns 201. A first clad layer 221 may be provided on a bottom surface of the active layer 301. A second clad layer 321 may be provided on a top surface of the active layer 301. The first clad layer 221 may be an n-type clad layer. The second clad layer 321 may be a p-type clad layer. The active layer 301 may be a gain layer. According to an example embodiment, the active layer 301 and the first and second clad layers 221 and 321 may constitute a single gain layer.

A second contact layer pattern 401 may be provided on each second clad layer 321. The second contact layer pattern 401 may include, for example, a p-type contact layer. An opening layer 351 may be provided between the second clad layer 321 and the second contact layer pattern 401. An insulating passivation layer 501 may be provided on the DBR 151 to fill a space between the plurality of VCSELs LS20*a*. The nanostructure reflector NR20*a* may be provided on each second contact layer pattern 401.

The first contact metal 251 connecting the plurality of first contact layer patterns 201 in a first direction may be provided. A part of the first contact metal 251 may be formed to penetrate the passivation layer 501 and may have a bridge structure to interconnect the plurality of first contact layer patterns 201. The first contact metal 251 may be an n-contact metal. The plurality of first contact layer patterns 201 and the first contact metal 251 connecting the plurality of first contact layer patterns 201 may constitute one first wiring pattern.

A second contact metal 601 may be provided on the second contact layer pattern 401 and the passivation layer 501 around the nanostructure reflector NR20a. The second contact metal 601 may be a p-contact metal. The second contact metal 601 may have a structure extending in a second direction and may form at least a part of a second wiring pattern. The second contact metal 601 may be configured to connect the plurality of second contact layer patterns 401 in the second direction.

Figure 24:
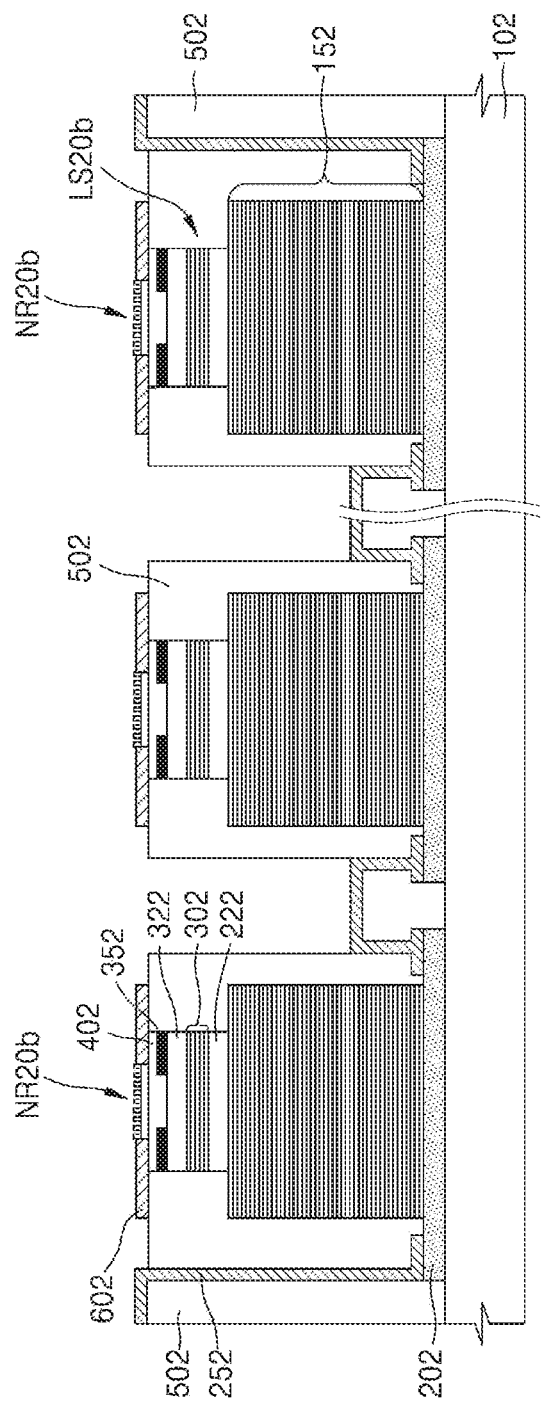
FIG. 24 is a cross-sectional view showing a cross-sectional structure taken along line A-B of FIG. 22 according to an example embodiment.

FIG. 24 is a cross-sectional view showing a cross-sectional structure taken along the line A-B of FIG. 22 according to an example embodiment.

Referring to FIG. 24, a plurality of VCSELs LS20b may be provided on a substrate 102. The VCSEL LS20b may include an active layer 302 generating light, a DBR 152 disposed at a lower portion of the active layer 302, and a nanostructure reflector NR20b disposed at an upper portion of the active layer 302.

A plurality of first contact layer patterns 202 may be provided on the substrate 102. The plurality of first contact layer patterns 202 may be patterned in an island shape and arranged two-dimensionally. The plurality of first contact layer patterns 202 may include, for example, an n-type doped layer. The DBR 152 may be provided on each first contact layer pattern 202. The DBR 152 may be an undoped DBR. The active layer 302 may be disposed on each DBR 152. A first clad layer 222 may be provided on a bottom surface of the active layer 302. A second clad layer 322 may be provided on a top surface of the active layer 302. A second contact layer pattern 402 may be provided on each second clad layer 322. The second contact layer pattern 402 may include, for example, a p-type contact layer. An opening layer 352 may be provided between the second clad layer 322 and the second contact layer pattern 402. An insulating passivation layer 502 may be provided on the substrate 102 to fill a space between the plurality of VCSELs LS20b. The nanostructure reflector NR20b may be provided on each second contact layer pattern 402.

A first contact metal 252 connecting the plurality of first contact layer patterns 202 in a first direction may be provided. A part of the first contact metal 252 may be formed to penetrate the passivation layer 502 and may have a bridge structure to interconnect the plurality of first contact layer patterns 202. The first contact metal 252 may be an n-contact metal. The plurality of first contact layer patterns 202 and the first contact metal 252 connecting the plurality of first contact layer patterns 202 may constitute one first wiring pattern.

A second contact metal 602 may be provided on the second contact layer pattern 402 and the passivation layer 502 around the nanostructure reflector NR20b. The second contact metal 602 may be a p-contact metal. The second contact metal 602 may have a structure extending in the second direction and may form at least a part of a second wiring pattern.

An example of a method of operating the addressable VCSEL array device of FIG. 22 will now be described.

In an individual VCSEL operation method, VCSEL(1,1) is ON when r1 is ON and c1 ON, VCSEL(1,2) is ON when: r1 is ON and c2 is ON, . . . VCSEL(8,13) is ON when r8 is ON and c13 is ON.

In an example line-by line VCSEL operation method VCSEL(1st row) is ON when r1 is ON and c1~c13 is ON, VCSEL(2nd row) is ON when r2 is ON and c1~c13 is ON, . . . , VCSEL(8th row) is ON when r8 is ON and c1~c13 is ON.

In another example line-by-line VCSEL operation method, VCSEL($1^{st}$ column) is ON when r1~r8 is ON and cl is ON, VCSEL(2nd column) is ON when r1~r8 is ON and c2 is ON, . . . , VCSEL(13th column) is ON: r1~r8 is ON and c13 is ON.

In the individual VCSEL operation method, a plurality of VCSELs may operate individually. In the line-by-line operation method, VCSELs of each row may operate sequentially, or VCSELs of each column may operate sequentially. In each method, the order of operations may be changed.

The VCSEL employing the above-described nanostructure reflector is advantageous for downsizing of a device, improving an operation speed, and low power consumption, and also may change the optical properties of emitted light. Thus, the VCSEL may be employed for various fields such as optical sensors, photonic integrated circuit (IC) systems, and, in addition, may be utilized in various electronic and optical apparatuses.

Figure 25:
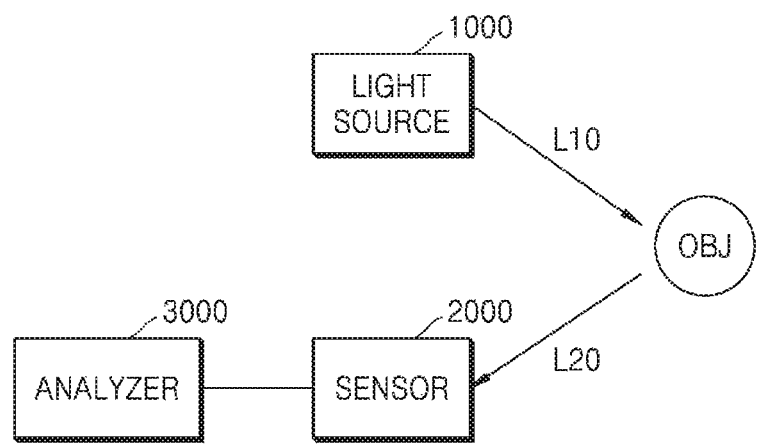
FIG. 25 is a block diagram showing a schematic structure of an electronic apparatus according to an example embodiment.

FIG. 25 is a block diagram showing a schematic structure of an electronic apparatus (an optical apparatus) according to an example embodiment.

Referring to FIG. 25, the electronic apparatus (the optical apparatus) according to an example embodiment may include a light source 1000 irradiating light L10 toward an object OBJ, and a sensor 2000 detecting light L20 emitted from the light source 1000 and modulated by the object OBJ. Here, the light source 1000 may include an addressable VCSEL array device according to example embodiments. The electronic apparatus may further include an analyzer 3000 analyzing the light detected by the sensor 2000 and analyzing at least one of physical properties, a shape, a position, and a motion of the object OBJ. The analyzer may be implemented by a processor.

Optical elements performing an additional operations such as adjusting a direction of the light in the light source 1000 toward the object OBJ, adjusting the size of the beam, or modulating the light to a pattern light may be further provided between the light source 1000 and the object OBJ. When a nanostructure reflector provided in the light source 1000 is designed to perform such operations, such optical elements may be omitted. The sensor 2000 may sense the light L20 modulated and reflected by the object OBJ. The sensor 2000 may include an array of light detection elements. The sensor 2000 may further include a spectroscopic device for analyzing the light L20 modulated and reflected by the object OBJ for each wavelength.

The analyzer 3000 may analyze at least one of the physical properties, the shape, the position, and the motion of the object OBJ by analyzing the light received by the sensor 2000. A 3D shape, position, and motion of the object OBJ may be analyzed by comparing a pattern of the light L10 irradiated on the object OBJ with a pattern of the light L20 reflected from the object OBJ. According to an example embodiment, a wavelength of the light excited in the object OBJ may be analyzed by the incident light (i.e. L10) to determine the physical properties of the object OBJ.

The electronic apparatus (the optical apparatus) according to an example embodiment may further include a controller or processor controlling driving of the light source 1000 or operation of the sensor 2000. Also, the electronic apparatus (the optical apparatus) may further include a memory storing a calculation program for extracting 3D information that is to be performed by the analyzer 3000 and the like. Information about a calculation result in the analyzer 3000, that is, information about the shape, position, physical properties, etc. of the object OBJ, may be transmitted to another device. For example, the above information may be transmitted to a controller of a device including the electronic apparatus.

The electronic apparatus (the optical apparatus) according to an example embodiment may also be utilized as a sensor precisely acquiring 3D information about a front object and may be employed in various electronic devices. Such an electronic device may be, for example, an autonomous driving device such as an unmanned vehicle, an autonomous vehicle, a robot, a drone or the like, as well as an augmented reality device, a mobile communication device, or an Internet of things (loT) device.

The configuration of the electronic apparatus (the optical apparatus) described with reference to FIG. 25 is an example, and the addressable VCSEL array device according to an embodiment may be applied to various electronic apparatuses (optical apparatuses). The addressable VCSEL array device may be applied to various fields such as imaging devices, projectors, and sensors.

Although example embodiments have been described above, they should not be construed as limiting the scope of the disclosure, but rather should be construed as examples embodiments. For example, one of ordinary skill in the art will appreciate that configurations of the nanostructure reflector, the VCSEL array, and the optical device including the nanostructure reflector and the VCSEL array described with reference to FIGS. 1 to 25 may be variously changed.

It should be understood that example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An addressable vertical cavity surface emitting laser (VCSEL) array device comprising:
   a plurality of VCSELs, each of the plurality of VCSELs comprising a distributed Bragg reflector (DBR), a nanostructure reflector, and a gain layer disposed between the DBR and the nanostructure reflector, wherein the nanostructure reflector comprises a plurality of nanostructures having a sub-wavelength dimension;
   a plurality of first wiring patterns extending in a first direction and electrically connected to the plurality of VCSELs, respectively; and
   a plurality of second wiring patterns extending in a second direction intersecting the first direction and electrically connected to the plurality of VCSELs, respectively, and
   wherein the plurality of VCSELs are disposed at intersections of the plurality of first wiring patterns and the plurality of second wiring patterns, and
   wherein the addressable VCSEL array device is configured to selectively drive at least some of the plurality of VCSELs.

2. The addressable VCSEL array device of claim 1, further comprising:
   a substrate;
   a flat type mirror layer disposed on the substrate, the DBR being included in the flat type mirror layer; and
   a plurality of contact layer patterns extending in the first direction and disposed on the flat type mirror layer,
   wherein a plurality of the gain layers included in each of the plurality of VCSELs are disposed on each of the plurality of contact layer patterns, and
   wherein the nanostructure reflector is disposed on each of the plurality of gain layers.

3. The addressable VCSEL array device of claim 2, further comprising an insulating passivation layer disposed on the flat type mirror layer and filling a space between the plurality of VCSELs,
   wherein the insulating passivation layer is disposed to cover the plurality of first wiring patterns, and
   wherein the plurality of second wiring patterns are disposed on the insulating passivation layer.

4. The addressable VCSEL array device of claim 2, wherein the plurality of first wiring patterns are disposed on the plurality of contact layer patterns, are respectively spaced apart from the plurality of gain layers, and are electrically connected to lower surfaces of the plurality of gain layers, respectively, and
   wherein the plurality of second wiring patterns are disposed on the plurality of gain layers, and are electrically connected to upper surfaces of the plurality of gain layers, respectively.

5. The addressable VCSEL array device of claim 4, wherein the plurality of first wiring patterns comprise a plurality of first openings configured to expose the plurality of contact layer patterns, respectively, and
   wherein the plurality of gain layers are disposed in the plurality of first openings, respectively.

6. The addressable VCSEL array device of claim 4, wherein the plurality of second wiring patterns comprise a plurality of second openings, and
   wherein each of the plurality of second openings are configured to expose each of the plurality of nanostructure reflectors.

7. The addressable VCSEL array device of claim 1, wherein each of the plurality of first wiring patterns comprises a first pattern portion surrounding each of the plurality of gain layers and a second pattern portion extending from both ends of the first pattern portion, and
   wherein the second pattern portion has a smaller width than the first pattern portion.

8. The addressable VCSEL array device of claim 7, wherein the first pattern portion has one of a circular, elliptical or rectangular structure with an opening region at a center thereof.

9. The addressable VCSEL array device of claim 1, further comprising a ring type electrode disposed on each of the plurality of gain layers,
   wherein the second wiring pattern is formed to electrically contact the ring type electrode.

10. The addressable VCSEL array device of claim 1, further comprising:
    a substrate;
    a flat type mirror layer disposed on the substrate, the DBR being included in the flat type mirror layer;

a plurality of first contact layer patterns disposed on the flat type mirror layer;
a plurality of the gain layers disposed on the plurality of first contact layer patterns;
a plurality of second contact layer patterns disposed on the plurality of gain layers;
a plurality of the nanostructure reflectors disposed on the plurality of second contact layer patterns,
wherein each of the plurality of first wiring patterns comprise a first contact metal interconnecting at least two of the plurality of first contact layer patterns, and
wherein each of the plurality of second wiring patterns comprise a second contact metal interconnecting at least two of the plurality of second contact layer patterns.

11. The addressable VCSEL array device of claim 1, further comprising:
a substrate;
a plurality of first contact layer patterns disposed on the substrate,
a plurality of the DBRs disposed on the plurality of first contact layer patterns;
a plurality of the gain layers disposed on the plurality of DBRs;
a plurality of second contact layer patterns disposed on the plurality of gain layers;
a plurality of the nanostructure reflectors disposed on the plurality of second contact layer patterns,
wherein each of the plurality of first wiring patterns comprise a first contact metal interconnecting at least two of the plurality of first contact layer patterns, and
wherein each of the plurality of second wiring patterns comprise a second contact metal interconnecting at least two of the plurality of second contact layer patterns.

12. The addressable VCSEL array device of claim 1, wherein at least one of a thickness, a width, and an arrangement distance of the plurality of nanostructures included in the nanostructure reflector has a value of ½ or less of an oscillation wavelength of the plurality of VCSELs.

13. The addressable VCSEL array device of claim 1, wherein a size and an arrangement of the plurality of nanostructures are determined such that the nanostructure reflector is configured to act as a concave mirror with respect to the gain layer corresponding to the nanostructure reflector.

14. The addressable VCSEL array device of claim 1, wherein a reflectance of the DBR is higher than a reflectance of the nanostructure reflector.

15. The addressable VCSEL array device of claim 1, wherein the gain layer comprises a III-V semiconductor material or a II-VI semiconductor material.

16. The addressable VCSEL array device of claim 1, further comprising:
a first driver electrically connected to the plurality of first wiring patterns; and
a second driver electrically connected to the plurality of second wiring patterns.

17. The addressable VCSEL array device of claim 1, wherein the plurality of VCSELs comprise a first VCSEL and a second VCSEL, and
wherein at least one of an oscillation wavelength and a polarization characteristic of the first VCSEL and the second VCSEL are different.

18. The addressable VCSEL array device of claim 17, wherein a plurality of first VCSELs and a plurality of second VCSELs are arranged in a plurality of columns and a plurality of rows, respectively, and
wherein the plurality of columns of the plurality of first VCSELs and the plurality of rows of the plurality of second VCSELs are alternately arranged.

19. The addressable VCSEL array device of claim 17, wherein a plurality of first VCSELs and a plurality of second VCSELs are arranged in a plurality of columns and a plurality of rows, respectively,
wherein the plurality of first VCSELs and the plurality of second VCSELs are alternately arranged in each column, and
wherein the plurality of first VCSELs and the plurality of second VCSELs are alternately arranged in each row.

20. An electronic apparatus, the electronic apparatus comprising:
an addressable vertical cavity surface emitting laser (VCSEL) array device comprising:
a plurality of VCSELs, each of the plurality of VCSELs comprising a distributed Bragg reflector (DBR), a nanostructure reflector, and a gain layer disposed between the DBR and the nanostructure reflector, wherein the nanostructure reflector comprises a plurality of nanostructures having a sub-wavelength dimension;
a plurality of first wiring patterns extending in a first direction and being electrically connected to the plurality of VCSELs, respectively; and
a plurality of second wiring patterns extending in a second direction intersecting the first direction and being electrically connected to the plurality of VCSELs, respectively, and
wherein the plurality of VCSELs are disposed at intersections of the plurality of first wiring patterns and the plurality of second wiring patterns, and
wherein the addressable VCSEL array device is configured to selectively drive at least some of the plurality of VCSELs.

21. The electronic apparatus of claim 20, wherein the electronic apparatus is a light source apparatus.

22. The electronic apparatus of claim 20, further comprising:
a light source comprising the addressable VCSEL array device; and
a sensor configured to detect light reflected by an object that is irradiated with light emitted from the light source.

* * * * *